US011885622B2

(12) United States Patent
Ducloux et al.

(10) Patent No.: US 11,885,622 B2
(45) Date of Patent: Jan. 30, 2024

(54) INTERFEROMETER WITH A LOOPED OR STRAIGHT OPTICAL FIBER

(71) Applicant: EXAIL, Saint-Germain-en-Laye (FR)

(72) Inventors: Eric Ducloux, Saint-Germain-en-Laye (FR); Cédric Molucon, Saint-Germain-en-Laye (FR); Hervè Lefevre, Saint-Germain-en-Laye (FR)

(73) Assignee: EXAIL, Saint-Germain-en-Laye (FR)

( * ) Notice: Subject to any disclaimer, the term of this patent is extended or adjusted under 35 U.S.C. 154(b) by 125 days.

(21) Appl. No.: 17/603,797

(22) PCT Filed: Apr. 14, 2020

(86) PCT No.: PCT/EP2020/060408
§ 371 (c)(1),
(2) Date: Mar. 16, 2022

(87) PCT Pub. No.: WO2020/212314
PCT Pub. Date: Oct. 22, 2020

(65) Prior Publication Data
US 2023/0160697 A1    May 25, 2023

(30) Foreign Application Priority Data
Apr. 15, 2019   (FR) ..................................... 1904009

(51) Int. Cl.
*G01C 19/72*    (2006.01)
*G01R 15/24*    (2006.01)

(52) U.S. Cl.
CPC ......... *G01C 19/727* (2013.01); *G01R 15/246* (2013.01)

(58) Field of Classification Search
CPC .... G01C 19/72; G01C 19/726; G01C 19/727; G01R 15/246
See application file for complete search history.

(56) References Cited

U.S. PATENT DOCUMENTS

| 10,302,411 B2 * | 5/2019 | Gu .......................... G01D 5/266 |
| 11,079,231 B2 * | 8/2021 | Quatraro ................ G01C 19/72 |

(Continued)

FOREIGN PATENT DOCUMENTS

| CN | 107356266 A | * 11/2017 | ........... G01C 25/005 |
| EP | 2005113 | 2/2011 | |

(Continued)

OTHER PUBLICATIONS

International Search Report for PCT/EP2020/060408 dated Jul. 8, 2020, 4 pages.

(Continued)

*Primary Examiner* — Michael A Lyons
(74) *Attorney, Agent, or Firm* — NIXON & VANDERHYE

(57) ABSTRACT

A fiber-optic interferometer is designed to receive and propagate a first single-mode wave along a first optical path and, respectively, a second single-mode wave along a second optical path, the second optical path being the reverse of the first optical path, and to form a first output wave and, respectively, a second output wave, having a modulated phase difference $\Delta\phi_m(t)$. According to the invention, the modulated phase difference $\Delta\phi_m(t)$ is equal to sum of a first periodic phase difference $\Delta\phi_\pi(t)$ having a level equal to $\pm\pi$, a second periodic phase difference $\Delta\phi_{alpha}(t)$ having a level equal to $\pm$alpha and a third periodic phase difference $\Delta\phi_{beta}(t)$ having a variable level between −beta and +beta, said modulated phase difference $\Delta\phi_m(t)$ comprising per modulation period T at least eight modulation levels among twelve modulation levels and said modulated phase difference between such that: $\Delta\phi_m(t+T/2)=-\Delta\phi_m(t)$.

19 Claims, 7 Drawing Sheets

(56) References Cited

U.S. PATENT DOCUMENTS

| | | | | |
|---|---|---|---|---|
| 2004/0233456 A1* | 11/2004 | Standjord | ............ | G01C 19/721 |
| | | | | 356/464 |
| 2015/0009505 A1* | 1/2015 | Lefevre | ................ | G01C 19/662 |
| | | | | 356/460 |
| 2015/0116723 A1* | 4/2015 | Lefevre | ................ | G01C 19/726 |
| | | | | 356/464 |
| 2016/0231120 A1* | 8/2016 | Guattari | ............. | G02B 6/29347 |

FOREIGN PATENT DOCUMENTS

| | | |
|---|---|---|
| FR | 2654827 | 5/1991 |
| WO | 2013/160622 | 10/2013 |
| WO | 2017/220922 | 12/2017 |

OTHER PUBLICATIONS

Written Opinion of the ISA for PCT/EP2020/060408 dated Jul. 8, 2020, 6 pages.

Müller et al., "Inherent temperature compensation of fiber-optic current sensors employing spun highly birefringent fiber", Optics Express, vol. 24, No. 10, May 16, 2016, 10 pages.

Blake et al., "In-Line Sagnac Interferometer Current Sensor", IEEE Transactions on Power Delivery, vol. 11, No. 1, Jan. 1996, pp. 116-121.

\* cited by examiner

INTERFEROMETER WITH A LOOPED OR STRAIGHT OPTICAL FIBER

This application is the U.S. national phase of International Application No. PCT/EP2020/060408 filed Apr. 14, 2020 which designated the U.S. and claims priority to FR Patent Application No. 1904009 filed Apr. 15, 2019, the entire contents of each of which are hereby incorporated by reference.

TECHNICAL FIELD

The present invention generally relates to the field of interferometer systems.

More particularly, it relates to a fiber-optic loop or in-line interferometer system. Such an interferometer system finds in particular applications in fiber-optic gyroscopes (FOG, see the "The Fiber-Optic Gyroscope", H. C. Lefévre, Artech House, Second Edition, 2014). Such an interferometer system also finds applications in electric current sensors (or FOCS, for fiber-optic current sensor) or in magnetic field sensors.

In particular, it relates to a high-accuracy fiber-optic interferometer system and method.

PRIOR ART

FIG. 1 schematically shows a fiber-optic Sagnac loop interferometer system of the prior art. This fiber-optic interferometer system includes a light source 20 emitting a source beam 100, a source-receiver splitter 22, called receiver splitter, a multifunction integrated optical circuit (denoted MIOC) 14, an optical fiber coil 17, a photosensor 18 and a signal processing system 900. The integrated optical circuit 14 comprises optical waveguides preferably formed by proton exchange (or APE, for Annealed Proton Exchange) on a planar electro-optical substrate, for example made of lithium niobate. The proton exchange on lithium niobate leads to the formation of single-polarization guides. The input-output waveguide hence forms a single-mode waveguide polarizer 24 that guides only one linear polarization. The integrated optical circuit 14 also comprises a coil splitter 15 of the Y-junction type, formed by splitting of the input-output waveguide into two single-mode secondary branches. Advantageously, the integrated optical circuit 14 also comprises electrodes connected to an electric generator to form an electro-optical modulator or phase modulator 16 adapted to modulate the phase difference M between two counter-propagating beams. The planar substrate of the multifunction integrated optical circuit 14 can be easily connected, on one side, to the two ends of the optical fiber coil 17 and, on an opposite side, by a section of optical fiber 23, to the source-receiver splitter 22.

The coil splitter 15 spatially splits the source beam 100 into a first single-mode wave 101 and a second single-mode wave 102, which propagate in opposite directions in the optical fiber coil 17. At the coil output, the coil splitter 15 recombines these two single-mode waves to form an interferometric beam 300. The source-receiver splitter 22 guides the interferometric beam 300 to the photosensor 18. The sensor 18 receives the interferometric beam and generates a detected signal 80.

The signal processing system 900 comprises for example an analog-digital converter 19, a digital processor 30, for example of the DSP (Digital Signal Processor), FPGA (Field Programmable Gate Array) or ASIC (Application Specific Integrated Circuit) type, and a digital-analog converter 31.

The digital processor 30 makes it possible to extract a signal from a parameter to be measured 90, for example rotation rate, on a digital output. The digital-analog converter 31 makes it possible to apply a modulation voltage 60 to the electrodes of the optical phase modulator 16.

When the interferometer system is at rest, the two divided beams emerge from the optical fiber coil in phase with each other, due to the reciprocity of the optical paths in the optical fiber coil.

However, in the presence of physical phenomena liable to produce non-reciprocal effects on the optical path of the two contra-propagative beams in the optical fiber coil 7, a phase difference appears in the detected interferometric beam. The open-loop response of an interferometer system as described hereinabove is a function of the phase difference $\Delta\Phi$ linked to the quantity to be measured according to the following equation, in which P is the power of the return interferometric beam 300, $P_0$ being the maximum return power when $\Delta\Phi=0$.

$$P = \frac{P_0}{2}(1 + \cos \Delta\Phi) \quad \text{[Math 1]}$$

Among the main physical phenomena inducing non-reciprocal effects, the rotation of the interferometer system about the axis of the optical fiber coil induces a phase difference proportional to the rotation rate. From this property, called Sagnac effect, ensues the main application of a Sagnac loop interferometer to a gyroscope to measure a rotation rate about the axis of the optical fiber coil. Indeed, during a rotation of the interferometer about the axis of the optical fiber coil 17, a phase difference $\Delta\Phi_S$ is induced by the parameter to be measured. In the presence of a Sagnac effect in a FOG, the phase difference $\Delta\Phi_S$ is proportional to the rotation rate.

The Faraday effect or collinear magneto-optic effect is also known to produce non-reciprocal effects. The fiber-optic loop or in-line interferometers find applications as a magnetic field sensor or as an electric current sensor (see the publication J. Blake et al. "In-Line Sagnac Interferometer Current Sensor", IEEE Transactions on Power Delivery, Vol. 11, no 1, pages 116-121, 1996).

A conventional Sagnac interferometer, said Sagnac loop interferometer, uses a closed optical path, the same splitting optical component 15 splitting the two waves and recombining them, the two split waves travelling along the closed optical path in mutually opposite directions. In a fiber-optic loop interferometer, the two split waves use the same polarization state on the closed optical path. In a fiber-optic loop gyroscope, the two waves have the same linear polarization. In a loop current sensor, the two waves have the same circular polarization in the fiber-optic loop. In a fiber-optic in-line interferometer, a mirror is arranged at one end of the optical fiber coil, and the closed optical path is travelled by the two waves in the same direction and in orthogonal polarization states that are reversed on return (see the publication G. M. Muller et al. "Inherent temperature compensation of fiber-optic current sensors employing spun highly birefringent fiber", Optics Express, Vol. 24, No 10, 2016).

With respect to a loop system, such a fiber-optic in-line interferometer system is insensitive to the variations of many environment parameters but operates in an equivalent manner as regards the phase modulation.

The phase modulation techniques, well known from the person skilled in the art in the fiber-optic interferometers, are used to improve the sensitivity and the linearity of the interferometer response to a phase difference due to a non-reciprocal effect, for example the Sagnac effect or the collinear magneto-optic Faraday effect. In the present document, it is meant by quantity to be measured a phase difference induced by a non-reciprocal effect in a fiber-optic loop or in-line interferometer.

FIG. 2 shows a phase modulator 16 in a fiber-optic loop interferometer of the prior art.

In the field mentioned above, it is known to apply a modulated electric voltage $V_m(t)$ between the electrodes of the phase modulator 16 to modulate the phase difference $\Delta\Phi_m(t)$ of the measured interferometric signal. This modulation allows a biasing that increases the sensitivity of the interferometer system, in particular for low-amplitude rotation measurements. More precisely, the phase modulator 16 generates a phase shift $\Phi_m(t)$ that is reciprocal, i.e. perfectly identical in the two directions of propagation. However, there exists a propagation time difference, denoted $\Delta\tau$, between the longest optical path that passes through the optical fiber coil 17 and the shortest optical path that directly goes out towards the splitter-combiner 15. This propagation time difference $\Delta\tau$ is linked to the group velocity $v_g$ of the waves and not to their phase velocity vo. A modulation of the phase difference $\Delta\Phi_m(t)$ is hence obtained according to the following equation.

$$\Delta\Phi_m(t)=\Phi_m(t)-\Phi_m(t-\Delta\tau) \quad \text{[Math 2]}$$

This phase shift modulation $\Phi_m(t)$ is obtained by application of a modulated electric voltage $V_m(t)$ 60 to the electrodes of the phase modulator 16.

It is also possible to have a second modulator placed at the other end of the coil and to electrically connect it in reverse to double the modulation efficiency in a so-called push-pull configuration. The circuit 14 of FIG. 1 uses such a push-pull set-up for the modulator 16 that is placed on the two branches of the Y junction.

In particular, it is known to apply a so-called 2-states modulation, by square modulating the modulation voltage $V_m$ between two plateau values, in such a way as to produce a two-level modulation of the phase difference, for example $\Delta\Phi_b(t)=\pm\pi/2$, called biasing phase difference, at the eigen frequency $f_p$ of the optical fiber coil. The eigen frequency $f_p$ is defined in such a way that $T/2=1/(2\cdot f_p)=\Delta\tau$ where T is the period of the square modulation. Thus, the half-period of modulation T/2 corresponds to the group propagation time difference $\Delta\tau$ between the long optical path passing through the coil and the short optical path that connect the phase modulator 16 to the splitter 15. The detection system acquires the power of the interferometric beam at the interferometer output according to the two modulation states. The signal processing system digitizes the detected interferometric beam and demodulates the detected signal at $f_p$ by sampling two power measurements over each period of modulation and by allocating a negative sign to a first level and a positive sign to the following level. This modulation-demodulation scheme based on a square modulation voltage generating 2 states at the frequency $f_p$ makes it possible to obtain a better sensitivity of the interferometer system and a better stability of the measurements around zero, independently of the variations of the output power. It is to be noted that peaks are observed between the successive measurements of the detected signal.

It is also known to apply a 2-state square modulation with a modulation of the phase difference $\Delta\Phi_m(t)$ higher than $\pm\pi/2$, as for example $\pm 3\pi/4$ or $\pm 7\pi/8$. This overmodulation reduces the sensitivity but improves the signal-to-noise ratio of the interferometer system.

In order to extend and linearize the response dynamics of an interferometer system, it is also known to apply a counter-reaction signal. The demodulated signal is used as an error signal in a control loop to generate an additional phase difference $\Delta\Phi_{FB}$ that opposes the phase difference $\Delta\Phi_S$ of the quantity to be measured. The total phase difference $\Delta\Phi_{FB}+\Delta\Phi_S$ is controlled to zero and $-\Delta\Phi_{FB}$, which is equal $\Delta\Phi_S$, becomes the measurement, which makes it possible to obtain a linear response and a good stability of the latter, independently of the power variations and the gain of the detection system.

In the above-mentioned field, patent FR2654827_A1 proposes to apply a so-called 4-state modulation voltage that generates 4 successive levels of $\Delta\Phi_m(t)$ over each period of modulation T equal to $2\Delta\tau$. FIG. 3 illustrates an example of 4-state modulation. In FIG. 3 are respectively shown: at the bottom left, the modulation of the phase difference $\Delta\Phi$ as a function of time t; at the top left, the power P of the interferometric beam as a function of the phase difference $\Delta\Phi$; and, at the top right, the power P of the interferometric beam as a function of time. Over a period of modulation equal to $2\Delta\tau$, the 4 states i=1, 2, 3, 4 correspond to the 4 successive levels of $\Delta\Phi_m(t)$: i=1 for $\pi$–alpha; 2 for $\pi$+alpha; 3 for $-\pi$+alpha; 4 for $-\pi$–alpha, respectively. In the example illustrated in FIG. 3, for alpha=$\pi/4$, the 4 levels of $\Delta\Phi_m(t)$ are: $3\pi/4$, $5\pi/4$, $-3\pi/4$, $-5\pi/4$. This modulation is decomposed into a superimposition of a first $\pm\pi$ modulation at the eigen frequency $f_p$ (shown in dotted line in FIG. 3, at the bottom left) and a second $\pm\pi/4$ modulation in quadrature (shown in dashed line in FIG. 3, at the bottom left). The modulation resulting from the superimposition of the first $\pm\pi$ modulation and the second $\pm\pi/4$ modulation is shown in continuous line in FIG. 3, at the bottom left. This modulation $\Delta\Phi_m(t)$ has four levels per period of modulation. In practice, this can be obtained when the phase modulator generates a $\pm\pi/2$ modulation of the phase shift $\Phi_m(t)$ at the eigen frequency $f_p$ and a $\pm\pi/8$ modulation in quadrature. A counter-reaction digital phase ramp can be added. The steps of duration $\Delta\tau$ of this digital ramp are equal to $\Delta\Phi_{FB}$ and compensate for the signal phase difference $\Delta\Phi_S$. The four states corresponding to the four modulation levels are shown by points on the P vs phase difference $\Delta\Phi$ curve. In FIG. 3, at the top right, is shown the detected power P(t) as a function of time. 4 power measurements are sampled over each period of modulation. In other words, the power measurement detected by the detector receiving the interferometric beam corresponding to the four states i=1, ..., 4 over a period of modulation is denoted $P_i$. To extract the signal of the quantity to be measured, the signal processing system demodulates the power signal detected on 4 states by multiplying by +1 the two states corresponding to +alpha and by −1 the two states corresponding to −alpha, independently of the sign of $\pm\pi$ in these states. The signal of the quantity to be measured is here too demodulated at the eigen frequency $f_p$. In the 4-state modulation, the signal of the quantity to be measured, for example the Sagnac signal, has a square modulation at the eigen frequency $f_p$ and is in phase with the ±alpha modulation and in phase quadrature with the ±π modulation. In the 4-state modulation, the signal phase difference $\Delta\Phi_S$ of the quantity to be measured is calculated from the signal $S_S$ according to the following formula, where the power measurements $P_i$ for the states i=1, . . . , 4 are acquired over a period of modulation T equal to á $2\Delta\tau$.

$$S_S = -+P_2+P_3-P_4 \quad \text{[Math 3]}$$

In the 4-state modulation, it is also possible to extract a signal, denoted $V_\pi$, modulated at $2f_p$. The signal $V_\pi$ represents the transfer function of the phase modulator, i.e. the ratio between the voltage $V_m$ applied to the modulator and the induced phase shift $\Phi_m$, with $V_\pi/\pi = V_m/\Phi_m$. Now, this signal $V_\pi$ fluctuates with the environment, for example with the temperature. The demodulation of the signal $V_\pi$ is obtained by multiplying the power measurements $P_i$ sampled on each state by the sign of the product of the $\pm\pi$ and $\pm$alpha modulation signs. In other words, the sign + is applied for the measurements corresponding to the $+\pi$+alpha and $-\pi$–alpha states, and the sign − is applied for the measurements corresponding to the $+\pi$–alpha and $-\pi$+alpha states. The 4-state modulation makes it possible to simultaneously control the phase difference to zero and control the adjustment of the signal $V_\pi$. In the 4-state modulation, the error signal of the modulator transfer function, hence of $V_\pi$, is calculated according to the following formula.

$$S_{V_\pi} = -P_1+P_2-P_3+P_4 \quad \text{[Math 4]}$$

In the field of fiber-optic interferometer systems, patent EP2005113_B1 describes a so-called 6-state modulation, based on 4 levels of biasing phase difference. FIG. 4 illustrates an example of 6-state modulation modulated at $3f_p$. In FIG. 4 are shown: at the bottom left, the modulation of the phase difference $\Delta\Phi$ as a function of time t; at the top left, the power P of the interferometric beam as a function of the phase difference $\Delta\Phi$; and, at the top right, the power P of the interferometric beam as a function of time t over a period of modulation equal to $2\Delta\tau$, respectively. This 6-state modulation can be decomposed into a superimposition of a first $\pm\pi/2$ modulation of the phase-shift $\Phi_m(t)$ at the eigen frequency $f_p$ and a second $\pm$alpha/2 modulation of the phase shift $\Phi_m(t)$ at 3fp. The second modulation is synchronized with the first modulation. In other words, we obtain a modulated phase difference $\Delta\Phi_m(t)$ of $\pm\pi$ at the eigen frequency $f_p$ (shown in dotted line in FIG. 4, on the bottom left) and of $\pm$alpha at $3f_p$ (shown in dashed line in FIG. 4, on the bottom left). The phase difference modulation resulting from the superimposition of the $\pm\pi$ modulation and the $\pm$alpha modulation is shown in continuous line in FIG. 4, on the bottom left. This modulation $\Delta\Phi_m(t)$ has four levels per period of modulation. More generally, a modulated phase difference $\Delta\Phi_m(t)$ of $\pm\pi$ at the eigen frequency $f_p$ and of $\pm$alpha at $(2k+1).f_p$, where k is a natural integer higher than or equal to 1, is generated. The four modulation levels are shown by points on the P vs phase difference $\Delta\Phi$ curve. In FIG. 4, at the top right, is shown the detected power P(t) as a function of time. 6 power measurements are sampled over each period of modulation. With a 6-state modulation, the signal of the parameter to be measured, for example the Sagnac signal, is extracted at $3f_p$ by applying a demodulation multiplying by +1 power measurements corresponding to the +alpha states and by −1 the other power measurements corresponding to the −alpha states, independently of the sign of $\pm\pi$ in these states. In the 6-state modulation, the states are numbered: i=1 for $\pi$–alpha; i=2 for $\pi$+alpha; i=3 for $\pi$–alpha; i=4 for $-\pi$+alpha; i=5 for $-\pi$–alpha; and i=6 for $-\pi$+alpha. The signal of the quantity to be measured $S_S$ is calculated according to the following formula, where the power measurement $P_i$ for the states i=1, . . . , 6 are acquired over a period of modulation T equal to $2\Delta\tau$.

$$S_S = -P_1+P_2-P_3+P_4-P_5+P_6 \quad \text{[Math 5]}$$

In the 6-state modulation, it is also possible to extract a signal $V_\pi$. The demodulation of the signal $V_\pi$ is obtained by successively multiplying the sampled power measurements by 0, +1 and −1. Indeed, as in the 4-state configuration, the demodulation of the signal $V_\pi$ is obtained by multiplying the power measurements $P_i$, sampled on each state, by the sign of the product of the $\pm\pi$ and $\pm$alpha modulation signs, but while keeping only a same number of states multiplied by the sign + and states multiplied by the sign −. In the 6-state modulation, the error signal of the modulator transfer function is calculated by the following formula.

$$S_{V_\pi} = P_2-P_3+P_5-P_6 \quad \text{[Math 6]}$$

Patent EP2005113_B1 also describes the use of an 8-state and 8-level modulation overs a total period T equal to $4\Delta\tau$. According to this conventional 8-state modulation, the modulation is performed first on 4 high states corresponding to $\pm$(alpha+beta) then on 4 other low states corresponding to $\pm$(alpha–beta). FIG. 5 schematically shows at the top right the power P(t) detected at the interferometer system output as a function of the modulation phase difference $\Delta\Phi_m(t)$ (bottom left curve). This modulation $\Delta\Phi_m(t)$ has 8 levels over a period of modulation T equal to $4\Delta\tau$. The 8 modulation states are numbered 1 to 8 on the power measurement P(t) curve, on the top right, as a function of their order of appearance over a period of modulation. In FIG. 5, on the bottom left, are shown a 4-state$\pm\pi$ and $\pm$(alpha–beta) modulation at the eigen frequency $f_p$ (in dotted line), an additional −2beta, −2beta, +2beta, +2beta, zero, zero, zero and zero modulation over the period $4\Delta\tau$ (in dashed line); and, in continuous line, the total phase difference modulation resulting from the superimposition of these two modulations. This total modulation hence corresponds to the succession of a 4-state$\pm\pi$ and $\pm$(alpha+beta) modulation on 4 high states during a half-period $2\Delta\tau$ and a 4-state modulation on 4 low$\pm\pi$ and $\pm$(alpha–beta) states over the following half-period.

In the top left part of FIG. 5 are indicated the different modulation levels $a^+$ corresponds to the modulation level $\Delta\Phi_{a+} = \pi$+alpha+beta $a^-$ corresponds to the modulation level $\Delta\Phi_{a-} = \pi$+alpha−beta $b^+$ corresponds to the modulation level $\Delta\Phi_{b+} = \pi$–alpha+beta $b^-$ corresponds to the modulation level $\Delta\Phi_{b-} = \pi$–alpha−beta $c^+$ corresponds to the modulation level $\Delta\Phi_{c+} = -\pi$+alpha+beta $c^-$ corresponds to the modulation level $\Delta\Phi_{c-} = -\pi$+alpha−beta $d^+$ corresponds to the modulation level $\Delta\Phi_{d+} = -\pi$–alpha+beta $d^-$ corresponds to the modulation level $\Delta\Phi_{d-} = -\pi$–alpha−beta.

The output power P is sampled into 8 measurements Pi corresponding to the 8 states i=1, . . . , 8 per period of modulation. The modulation levels corresponding to these states are: d− for state 1; b− for state 2; a+ for state 3; c+ for state 4; d+ for state 5; b+ for state 6; a− for state 7; c− for state 8. The demodulation of the signal of the parameter to be measured (Sagnac for example) and that of the signal $V_\pi$ are made on the 8 states in a similar way to those of the 4-state configuration. In this 8-state modulation, the signal of the quantity to be measured is calculated according to the following formula, in which the power measurement Pi for the eight successive states i=1, . . . , 8 are acquired over a period of modulation T equal to $4\Delta\tau$.

$$S_S = -P_1 - P_2 + P_3 + P_4 - P_5 - P_6 + P_7 + P_8 \quad \text{[Math 7]}$$

In this 8-state modulation, the error signal of the modulator transfer function is calculated according to the following formula.

$$S_{V_\pi} = P_1 - P_2 + P_3 - P_4 + P_5 - P_6 + P_7 - P_8 \quad \text{[Math 8]}$$

In a fiber-optic interferometer system as described hereinabove, it is desirable to adjust the output power on the detector. For that purpose, in the 8-state modulation scheme described hereinabove, it is known to extract the transfer function of the interferometer detection system, also called open-loop response, and denoted $\Delta P$, in such a way as to control this open-loop response, for example, by adjusting the power of the light source. This measurement is made by detecting the power difference $\Delta P$ between the 4 high states ($d^-$; $b^-$; $a^+$; $c^+$) and the 4 low states ($d^+$; $b^+$; $a^-$; $c^-$) with a calculation according to the following formula.

$$S_{\Delta P} = P_1 + P_2 + P_3 + P_4 - P_5 - P_6 - P_7 - P_8 \quad \text{[Math 9]}$$

It is desirable to improve the performances of a fiber-optic loop or in-line interferometer system and in particular to increase the measurement accuracy, the stability, the linearity and/or the response dynamics of such a system.

DISCLOSURE OF THE INVENTION

In order to remedy the above-mentioned drawbacks of the state of the art, the present invention proposes a fiber-optic loop or in-line interferometer comprising a light source adapted to generate a source beam, an optical splitting device adapted to split the source beam into a first single-mode wave and a second single-mode wave, an electronic system adapted to apply a modulation electric voltage $V_m(t)$ to a phase modulator adapted to induce a same phase shift $\Phi_m(t)$ on the first single-mode wave and the second single-mode wave, an optical fiber set adapted to receive and propagate the first single-mode wave along a first optical path and the second single-mode wave along a second optical path, reverse of the first optical path, respectively, and to form after a propagation time difference $\Delta\tau$ a first output wave and a second output wave, respectively, having a modulated phase difference $\Delta\Phi_m(t) = \Phi_m(t) - \Phi_m(t-\Delta\tau)$, the optical fiber set having an eigen frequency $f_p$ equal to the inverse of the double of the propagation time difference $\Delta\tau$, the optical splitting device being adapted to recombine the first output wave and the second output wave and to form a temporally modulated interferometric beam and a detection system adapted to detect a power $P(t)$ of the interferometric beam as a function of time.

More particularly, it is proposed according to the invention an interferometer in which the modulated phase difference $\Delta\Phi_m(t)$ is equal to the sum of a first periodic phase difference $\Delta\Phi_\pi(t)$ of level equal to $\pm\pi$, a second periodic phase difference $\Delta\Phi_{alpha}(t)$ of level equal to $\pm$alpha and a third periodic phase difference $\Delta\Phi_{beta}(t)$ of variable level between -beta and +beta, alpha and beta having predetermined different values, in such a way that the modulated phase difference $\Delta\Phi_m(t)$ has a period of modulation T equal to an odd multiple (2M+1) of the double of the propagation time difference $\Delta\tau$, where M is a natural integer, the modulated phase difference $\Delta\Phi_m(t)$ having, per period of modulation T, at least eight modulation levels among the twelve following modulation levels: $\Delta\Phi_{a+} = \pi+\text{alpha}+\text{beta}$; $\Delta\Phi_{a-} = \pi+\text{alpha}-\text{beta}$; $\Delta\Phi_a = \pi+\text{alpha}$; $\Delta\Phi_{b+} = \pi-\text{alpha}+\text{beta}$; $\Delta\Phi_{b-} = \pi-\text{alpha}-\text{beta}$; $\Delta\Phi_b = \pi-\text{alpha}$; $\Delta\Phi_{c+} = -\pi+\text{alpha}+\text{beta}$; $\Delta\Phi_{c-} = -\pi+\text{alpha}-\text{beta}$; $\Delta\Phi_c = -\pi+\text{alpha}$; $\Delta\Phi_{d+} = -\pi-\text{alpha}+\text{beta}$; $\Delta\Phi_{d-} = -\pi-\text{alpha}-\text{beta}$; $\Delta\Phi_d = -\pi-\text{alpha}$ and this modulated phase difference being such that $\Delta\Phi_m(t+T/2) = -\Delta\Phi_m(t)$ at each time t comprised between 0 and T.

According to a particular and advantageous embodiment, the period of modulation T is equal to the double of the propagation time difference $\Delta\tau$, the first phase difference $\Delta\Phi_\pi(t)$ has a modulation frequency equal to the eigen frequency $f_p$ and the second phase difference $\Delta\Phi_{alpha}(t)$ and the third phase difference $\Delta\Phi_{beta}(t)$ have a same modulation frequency equal to an odd multiple (2N+1) of the eigen frequency $f_p$, where N is a non-zero natural integer, the second phase difference $\Delta\Phi_{alpha}(t)$ being synchronized with the first phase difference $\Delta\Phi_\pi(t)$, the third phase difference $\Delta\Phi_{beta}(t)$ being in phase quadrature with respect to the second phase difference $\Delta\Phi_a(t)$.

According to another particular and advantageous embodiment, the period of modulation T is equal to the double of the propagation time difference $\Delta\tau$, the third phase difference $\Delta\Phi_{beta}(t)$ having a modulation frequency equal to the eigen frequency $f_p$ and the first phase difference $\Delta\Phi_\pi(t)$ and the second phase difference $\Delta\Phi_{alpha}(t)$ have a same modulation frequency equal to an odd multiple (2N+1) of the eigen frequency $f_p$, where N is a non-zero natural integer, the second phase difference being in phase quadrature with respect to the first phase difference, the third phase difference $\Delta\Phi_{beta}(t)$ being synchronized with the first phase difference or with the second phase difference.

According to still another particular and advantageous embodiment, M is a non-zero integer, the first phase difference $\Delta\Phi_\pi(t)$ and the second phase difference $\Delta\Phi_{alpha}(t)$ have a same modulation frequency equal to the eigen frequency $f_p$, the second phase difference being in phase quadrature with respect to the first phase difference and the third phase difference $\Delta\Phi_{beta}(t)$ having a period of modulation equal to the period of modulation T, this third phase difference being synchronized with the first phase difference or the second phase difference.

Other non-limitative and advantageous features of the interferometer according to the invention, taken individually or according to all the technically possible combinations, are the following.

The detection system includes an electronic demodulation system adapted to extract a signal representative of a quantity to be measured, a transfer function signal of the phase modulator and/or a transfer function signal of the detection system from a series of at least 12 power measurements of the detected interferometric beam per period of modulation.

The signal representative of the quantity to be measured is equal to a sum of the interferometric beam power measurements acquired per period of modulation, each power measurement being multiplied by −1 for the levels corresponding to −alpha and by +1 for the levels corresponding to +alpha.

The transfer function signal of the phase modulator is equal to a sum of the interferometric beam power measurements acquired per period of modulation, each power measurement being multiplied by the sign of the product of the first ±π modulation sign and the second ±alpha modulation + or − sign, or by zero in such a way as to keep a same number of states multiplied by the sign + and states multiplied by the sign −.

The transfer function signal of the detection system is equal to a sum of the interferometric beam power measurements acquired per period of modulation, each power measurement being multiplied by the sign of the product of the second ±alpha modulation sign and the third ±beta modulation sign when the level of this last modulation is +beta or −beta, and by zero when the level of this third beta modulation is zero.

The modulated phase difference $\Delta\Phi_m(t)$ further includes a ramp composed of phase steps $\Delta\Phi_{FB}$ opposite to a phase difference $\Delta\Phi_S$ of the signal representative of the quantity to be measured.

The optical splitting device is adapted to spatially split the source beam into the first single-mode wave and the second single-mode wave and the optical fiber set includes an optical fiber coil adapted to receive the first single-mode wave at a first end of the optical fiber coil and the second single-mode wave at a second end of the optical fiber coil, respectively, the first single-mode wave and the second single-mode wave propagating in reverse direction in the optical fiber coil.

The first single-mode wave and the second single-mode wave are linearly polarized and the optical fiber coil is of the linear polarization maintaining type, the interferometer being adapted to measure a phase difference representative of a rotation about an axis of the optical fiber coil.

The optical fiber set includes a linear polarization maintaining optical fiber section, the circular polarization maintaining optical fiber coil and another linear polarization maintaining optical fiber section, a quarter-wave plate being arranged between the optical fiber section and an end of the optical fiber coil, another quarter-wave plate being arranged between the other optical fiber section and the other end of the optical fiber coil, the interferometer being adapted to measure a phase difference induced by an electric current running through the optical fiber coil.

The optical fiber set includes a linear polarization maintaining optical fiber section and a circular polarization maintaining optical fiber coil, the optical fiber section being connected to an end of the optical fiber coil, a mirror being arranged at a second end of the optical fiber coil, the interferometer being adapted to measure a phase difference induced by an electric current running through the optical fiber coil.

The interferometer comprises a feedback system adapted to control the measurement of the signal representative of the quantity to be measured, of the modulator transfer function signal and/or of the detection system transfer function signal.

Of course, the different features, alternatives and embodiments of the invention can be associated with each other according to various combinations, insofar as they are not incompatible with each other or exclusive from each other.

The fiber-optic interferometer of the present disclosure makes it possible to improve the measurement accuracy of the quantity to be measured, for example the Sagnac phase shift, by freeing from the errors induced by the RC time constant of the electric circuit controlling the phase modulator, which affects in particular the measurements obtained by a conventional 8-states modulation. The fiber-optic interferometer of the present disclosure also makes it possible to measure the interferometer transfer function by measuring the power difference $\Delta P$ between high states and low states.

BRIEF DESCRIPTION OF THE DRAWINGS

Moreover, various other features of the invention emerge from the appended description made with reference to the drawings that illustrate non-limitative embodiments of the invention and in which.

It is to be noted that, in these figures, the structural and/or functional elements common to the different variants can be denoted by the same references.

DETAILED DESCRIPTION

Figure 1:
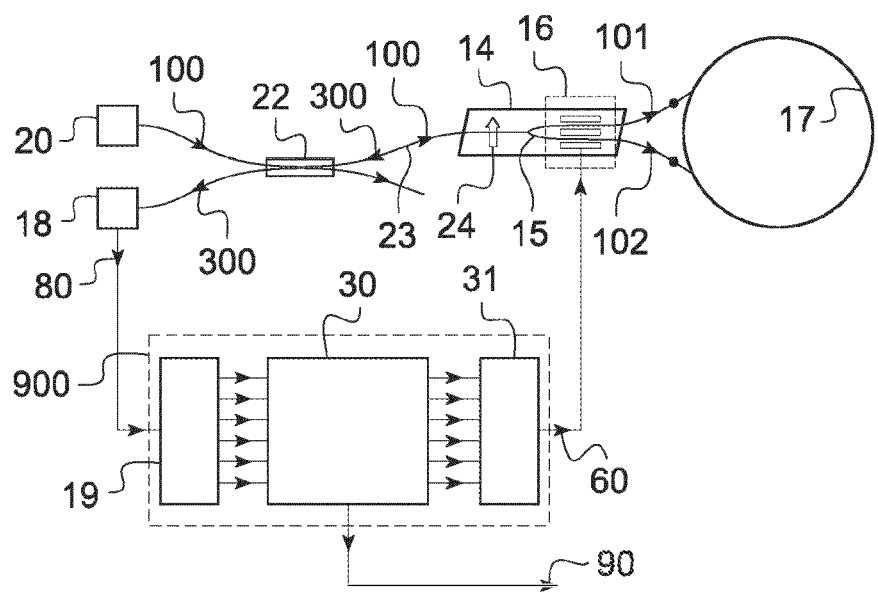
FIG. 1 schematically shows a fiber-optic Sagnac loop interferometer system for application to a fiber-optic gyroscope according to the prior art.
Figure 2:
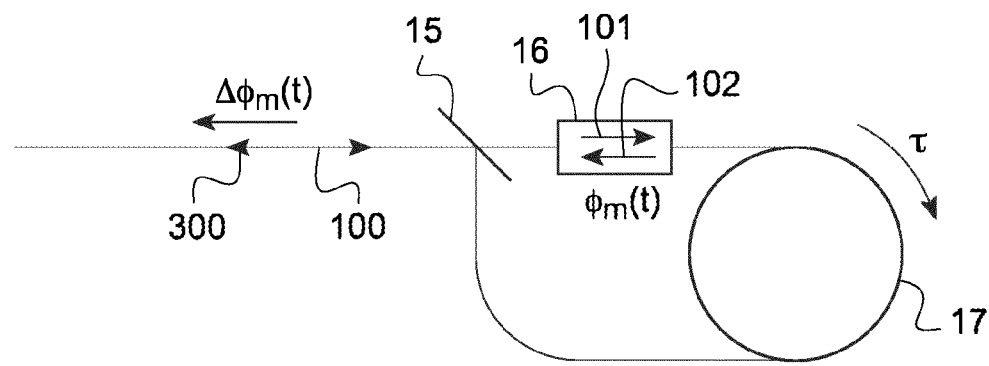
FIG. 2 shows a phase modulator in a fiber-optic loop interferometer system, for generating a modulated phase difference $\Delta\Phi_m(t)$ for biasing the signal according to the prior art.
Figure 3:
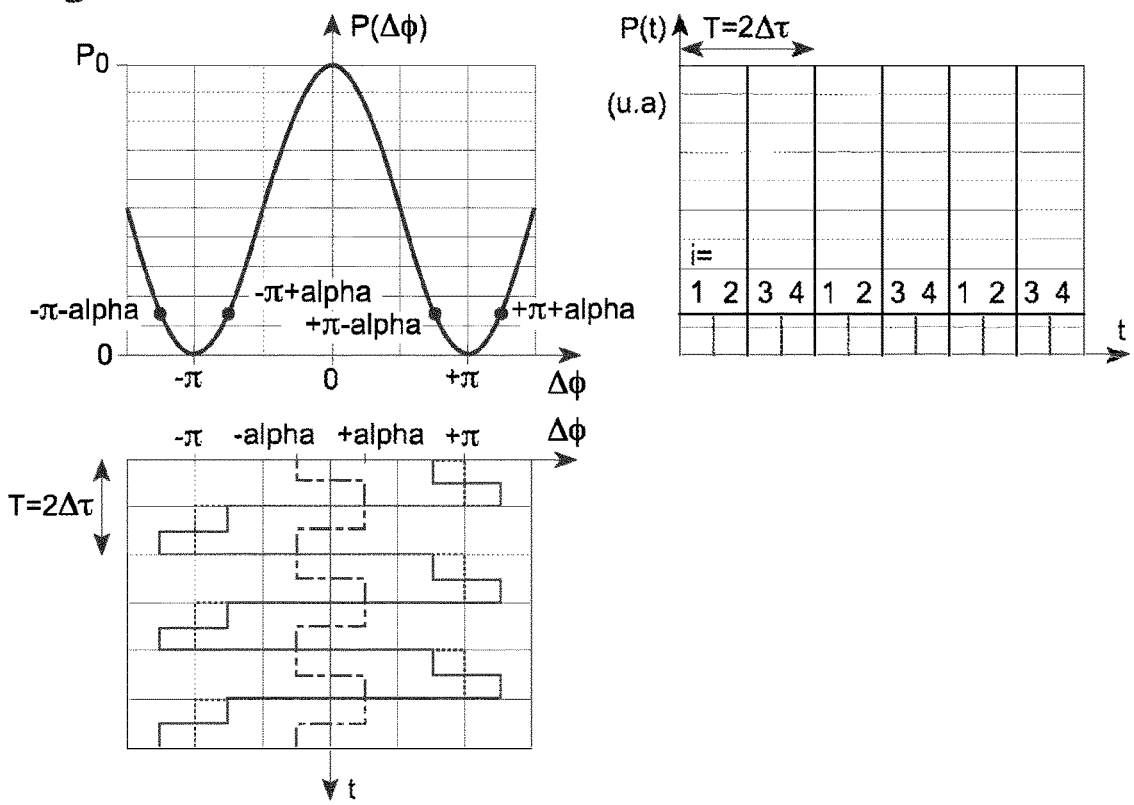
FIG. 3 schematically shows an example of modulated phase difference $\Delta\Phi_m(t)$ applied to a phase modulator, according to a 4-state modulation of the prior art, the position of the 4 modulation states on the interferometer response curve and the 4 measurements of detected power P(t) as a function of time, here over three periods of modulation.
Figure 4:
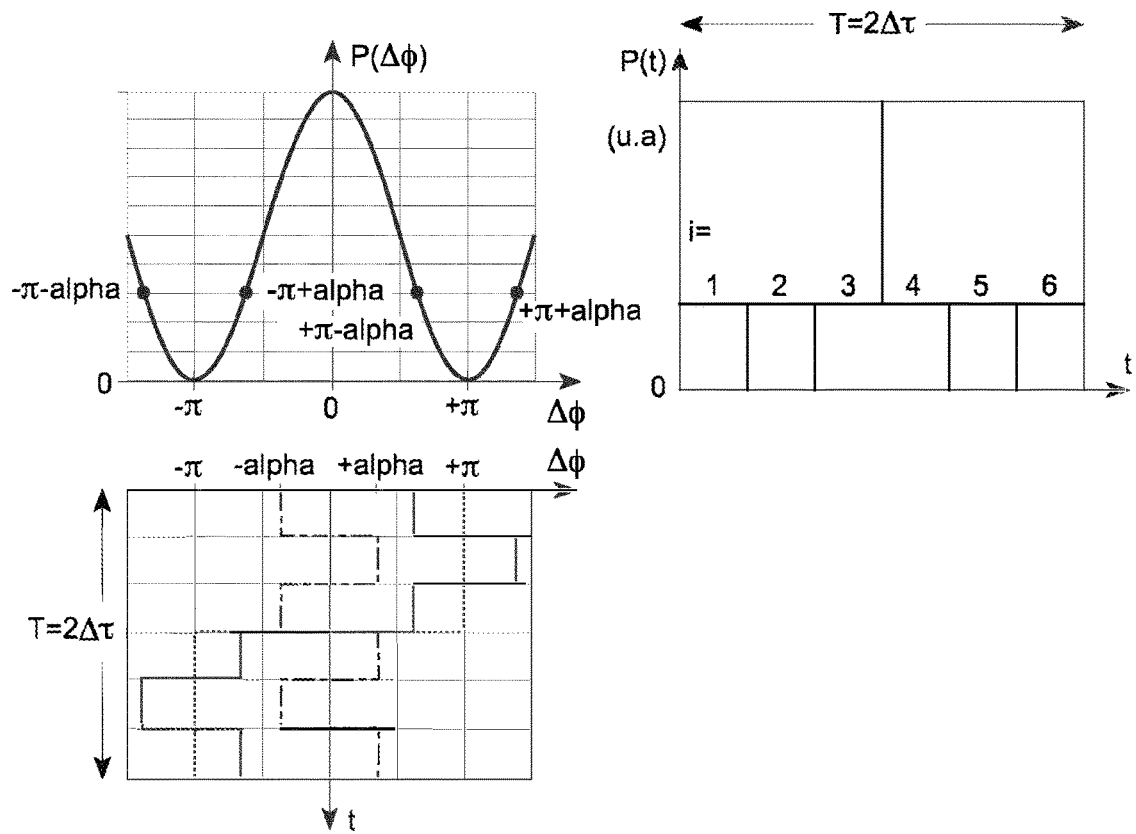
FIG. 4 schematically shows an example of modulated phase difference $\Delta\Phi_m(t)$ applied to a phase modulator, according to a 6-state modulation of the prior art, the position of the 6 modulation states on the response curve of the interferometer and the 6 measurements of detected power P(t) as a function of time, here over one period of modulation.

In a phase modulation interferometer system as described in relation with FIG. 1, the phase modulator 16 is powered by a control electric circuit that has an RC response time, also called time constant, linked to the load resistance R between the electrodes of this phase modulator and to the electrical capacitance C of these electrodes. The resistance R is of the order of 50 to 500 ohms. The electrical capacitance of an electrode of 10 mm long of a modulator on integrated optical circuit (for example, lithium niobate) is of the order of 3 pF, i.e. a capacitance C of about 12 pF for a pair of push-pull electrodes of 20 mm long. In this case, the value of the phase modulator RC time constant can be estimated to about 1 to 10 ns. Generally, the RC time constant of phase modulator control circuit is comprised between 0.5 and 50 ns. It can be noted that, with certain electrical assemblies, there is no load resistance between the electrodes and this time constant is then given by the gain-bandwidth product of the amplifier of the control circuit.

The present disclosure shows that this RC time constant can influence the performances of an interferometer system and proposes different modulation and demodulation schemes to reduce or even cancel the negative effects induced by the phase modulator RC time constant.

Figure 6:
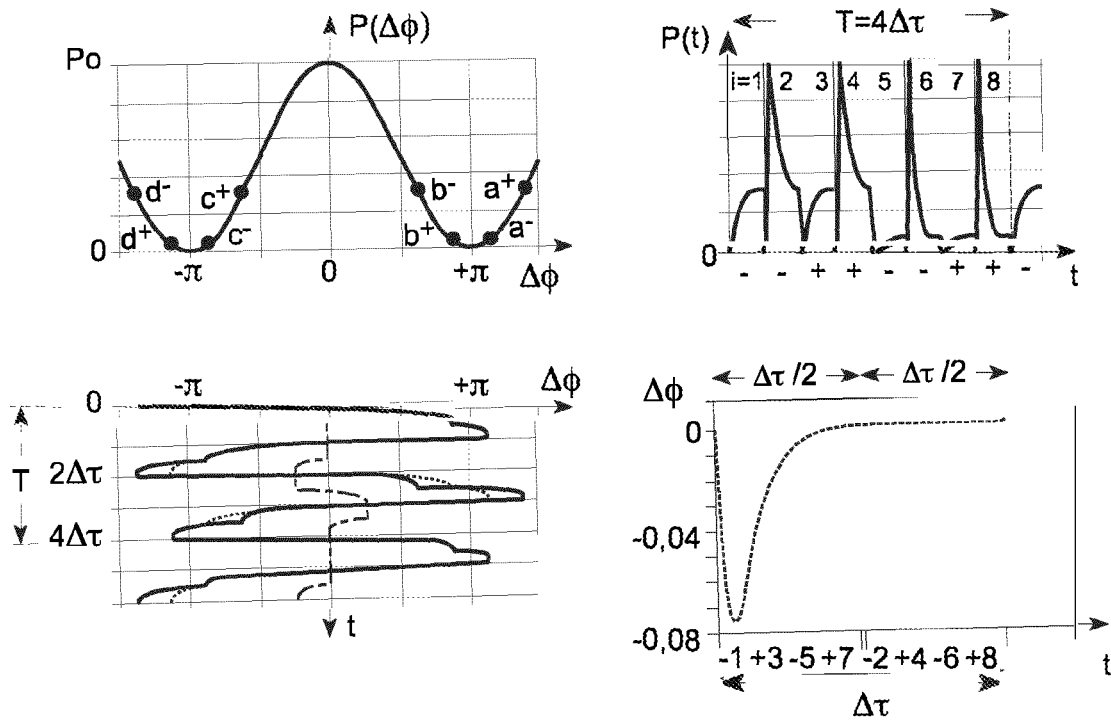
FIG. 6 schematically shows the modulated phase difference applied in the presence of an RC time constant of the phase modulation chain, in a conventional 8-state modulation, the effect of the RC time constant on the interferometer system power P(t) and the residual spurious signal in the absence of rotation of a Sagnac interferometer system obtained by conventional demodulation of this 8-state modulation.

FIG. 6 illustrates the case on a conventional 8-state modulation on which the effect of the RC electrical response time of the phase modulator is made appear. To make graphically appear the effect of the RC electrical response time in FIG. 6, we have chosen a high value of RC: $RC=\Delta\tau/12$. FIG. 6 schematically shows the power $P(t)$ detected at the interferometer system output as a function, on the one hand, of the phase difference $\Delta\Phi$ (top left curve) and, on the other hand, of the time t (top right curve).

FIG. 6 also shows the modulated phase difference $\Delta\Phi_m(t)$ as a function of time (bottom left curve). On this modulated phase difference $\Delta\Phi_m(t)$ vs time curve, it can be observed that this phase difference does not follow the ideal square shape but follows an exponential curve that reaches each phase difference level with a delay linked to the RC time constant.

Finally, FIG. 6 shows, at the bottom right, a time curve of power difference between states 1 and 3, and 5 and 7, as well as 2 and 4 and 6 and 8, as demodulated to measure the signal phase difference $\Delta\Phi_S$ with a conventional demodulation (see equation Math 7) in an 8-state interferometer, in the absence of rotation of this Sagnac interferometer.

Indeed, when the digital processor 10 and the digital-analog converter 11 generate a square modulation control signal $C_m(t)$ switching between two plateaus, the RC electrical response time results in that the control voltage $V_m(t)$ actually applied to the modulator and the modulated phase difference $\Delta\Phi_m(t)$ generated by the latter does not reach instantaneously the desired level. More precisely, each level of modulated phase difference $\Delta\Phi_m(t)$ follows an exponential curve in $(1-\exp(-t/RC))$ that starts from the preceding level and asymptotically tends towards the desired value for this level. On the power P vs time curve, it results therfrom that two states of the measured interferometer signal theoretically corresponding to a same power level but starting from different preceding levels are in fact not identical because they have not the same history. For the 8-state modulation, the conventional demodulation of the signal relating to the measured quantity is based on the differences between the measured powers for the pairs of states 1 and 3, 5 and 7, 2 and 4, 6 and 8 (see equation Math 7). In particular, state 8, that precedes state 1 (modulo T), is of lower level than state 2, that precedes state 3, so that states 1 and 3 are not perfectly identical, because they have not the same history, and their difference calculated in the demodulation is not perfectly zero in the absence of rotation, hence when $\Delta\Phi_S=0$. Likewise, state 4, preceding state 5, is of higher level than state 6, preceding state 7, so that states 5 and 7 are not either identical, neither having the same history. Now, it is fundamental that the demodulation of the signal of the quantity to be measured effectively gives zero and generates no defect when the parameter to be measured in the interferometer is zero, in particular no defect in a Sagnac interferometer in the absence of rotation.

On the bottom right curve in FIG. 6, it is observed that the power difference calculated in the demodulation of the quantity to be measured is not null, in particular for the difference between states 1 and 3, as well as 5 and 7. Such an interferometer system of the prior art hence generates defects. The order of magnitude of these defects can correspond to a spurious phase difference of the order of $10^{-4}$ to $10^{-5}$ radian, whereas a zero stability of the order of $10^{-8}$ to $10^{-9}$ radian is desired.

The present disclosure proposes different modulation and demodulation techniques adapted to alleviate or even cancel the defects induced by the RC time constant of the phase modulator control circuit in an interferometer system generating at least 8 levels per period of modulation and 12 states per period of demodulation.

Figure 7:
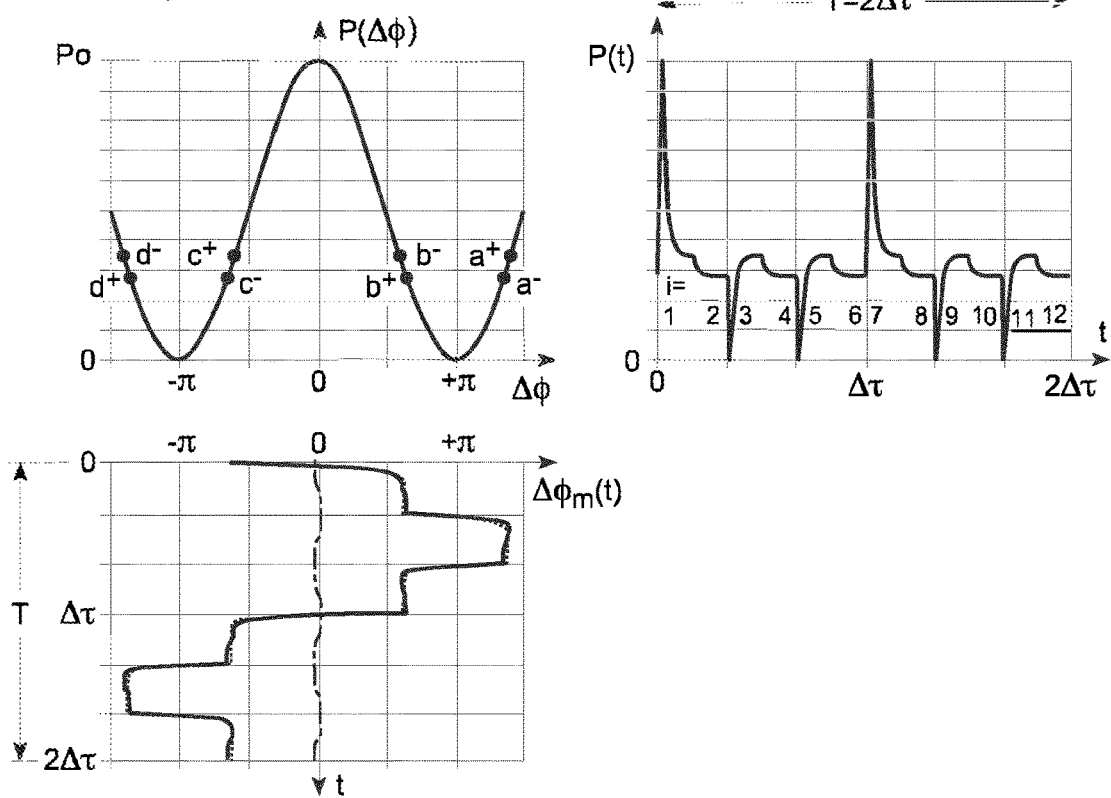
FIG. 7 illustrates a first embodiment based on a modulation with 8 levels of $\Delta\Phi_m(t)$ and 12 states of the corresponding detected power P(t)

FIG. 7 illustrates a first embodiment based on a 8-level and 12-state modulation.

In the following of the present document, it is meant by level (or modulation level) the asymptotic value of the different values of the modulated phase difference $\Delta\Phi_m$ for each modulation step. It is meant by modulation states, the different measured power P values corresponding to the modulation levels that follow each other over each period of modulation. Several states can use a same modulation level over a period of modulation.

In the first embodiment, in relation with FIG. 7, a modulation voltage is applied in accordance with 8 levels over a period of modulation T equal to $2\Delta\tau$. More precisely, a square modulation control signal $C_m(t)$ consisted of the sum of three square modulations is applied. The first square modulation is adapted to induce a first phase difference $\Delta\Phi_\pi(t)$ equal to $\pm\pi$. The first phase difference $\Delta\Phi_\pi(t)$ is periodic at the eigen frequency $f_p$. The second square modulation is adapted to induce a second phase difference $\Delta\Phi_{alpha}(t)$ equal to $\pm$alpha. The second phase difference $\Delta\Phi_{alpha}(t)$ is periodic and has a modulation frequency equal to an odd multiple (2N+1) of the eigen frequency $f_p$, where N is a natural integer higher than or equal to 1. The second phase difference $\Delta\Phi_{alpha}(t)$ is synchronized with the first phase difference $\Delta\Phi_\pi(t)$. The third square modulation is adapted to induce a third phase difference $\Delta\Phi_{beta}(t)$ equal to $\pm$beta. The third phase difference $\Delta\Phi_{beta}(t)$ is periodic and has a modulation frequency equal to the same odd multiple (2N+1) of the eigen frequency $f_p$. The third phase difference $\Delta\Phi_{beta}(t)$ is in phase quadrature with respect to the second phase difference $\Delta\Phi_{alpha}(t)$, in other words delayed by T/12 with respect to the second phase difference $\Delta\Phi_{alpha}(t)$ in the case where 2N+1=3. In the general case, this is a delay of $T/(4(2N+1))$. The modulated phase difference $\Delta\Phi_m(t)$ resulting from this modulation is equal to the sum of the first periodic phase difference $\Delta\Phi_\pi(t)$, the second phase difference $\Delta\Phi_{alpha}(t)$ and the third phase difference $\Delta\Phi_{beta}(t)$ according to the following equation.

$$\Delta\Phi_m(t)=\Delta\Phi_\pi(t)+\Delta\Phi_{alpha}(t)+\Delta\Phi_{beta}(t) \qquad [\text{Math 10}]$$

In the example illustrated in FIG. 7, the number N is equal to 1, the frequency of —, the second phase difference $\Delta\Phi_{alpha}$ (t) and of the third phase difference $\Delta\Phi_{beta}(t)$ is equal to $3f_p$ and the following values are chosen for alpha and beta: alpha=$3\pi/8$ and beta=$3\pi/128$. The period T is equal to $2\Delta\tau$, knowing that $\Delta\tau$ is of the order of 5 μs for one kilometer. The RC constant has been exaggerated with respect to reality to make FIG. 7 more readable. RC is herein equal to about ½₀ of Δτ.

Figure 5:
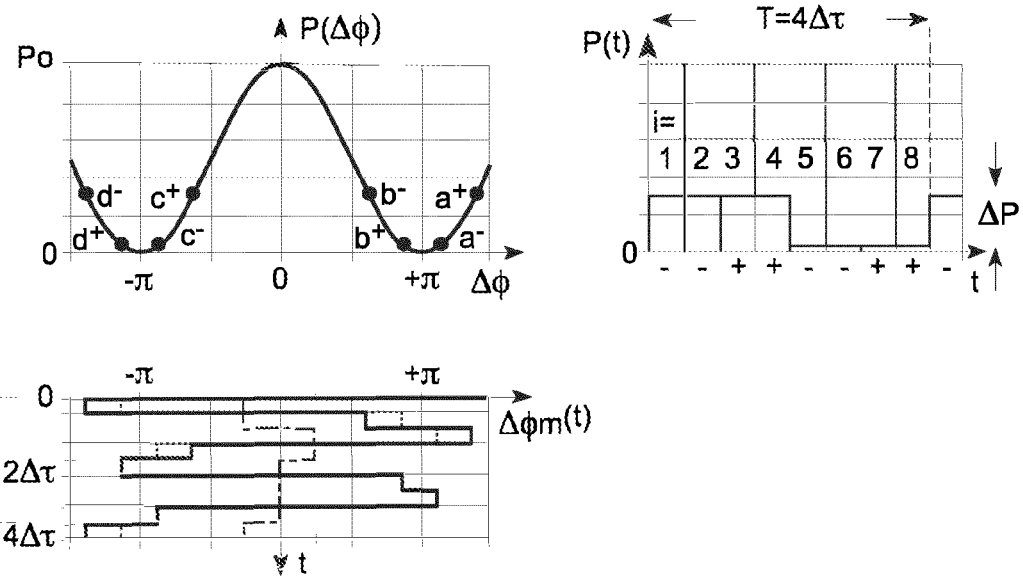
FIG. 5 schematically shows an example of modulated phase difference $\Delta\Phi_m(t)$ applied to a phase modulator, according to an 8-state modulation of the prior art, the position of the 8 modulation states on the interferometer response curve and the 8 measurements of detected power P(t) as a function of time.

On the $\Delta\Phi_m(t)$ curve of FIG. 7, the modulation according to 6 states/4 levels resulting from the sum of the first phase difference $\Delta\Phi_\pi(t)$ modulated at $f_p$ and the second phase difference $\Delta\Phi_{alpha}(t)$ modulated at $3f_p$ is shown in dotted line. The third phase difference $\Delta\Phi_{beta}(t)$ modulated on 2 levels at 3 $f_p$ in phase quadrature with respect to the second phase difference $\Delta\Phi_{alpha}(t)$ is shown in dashed line. Finally, the modulated phase difference $\Delta\Phi_m(t)$ or total modulation resulting from the sum of the dotted-line modulation and the dashed-line modulation is shown in continuous line. The modulated phase difference $\Delta\Phi_m(t)$ has 8 levels per period T=2Δτ. However, this 8-level modulation is different from the 8-level modulation of the prior art (illustrated for example in FIGS. 5 and 6). The effect of the RC time constant is observed on the modulated phase difference $\Delta\Phi_m(t)$ curve. Each level of modulated phase difference follows an exponential curve in (1−exp(−t/RC)) that starts from the preceding level.

At each period T, this modulation of the phase difference $\Delta\Phi_m(t)$ generates the following 8 modulation levels $\Delta\Phi_m(t)=\pm\pi\pm alpha\pm beta$. These eight modulation levels correspond to the points noted $a^+$, $a^-$, $b^+$, $b^-$, $c^+$, $c^-$, $d^+$ and $d^-$ on the power vs phase difference curve.

In FIG. 7, $a^+$ corresponds to the modulation level $\Delta\Phi_{a+}=\pi+alpha+beta$ $a^-$ corresponds to the modulation level $\Delta\Phi_{a-}=\pi+alpha-beta$ $b^+$ corresponds to the modulation level $\Delta\Phi_{b+}=\pi-alpha+beta$ $b^-$ corresponds to the modulation level $\Delta\Phi_{b-}=\pi-alpha-beta$ $c^+$ corresponds to the modulation level $\Delta\Phi_{c+}=-\pi+alpha+beta$ $c^-$ corresponds to the modulation level $\Delta\Phi_{c-}=-\pi+alpha-beta$ $d^+$ corresponds to the modulation level $\Delta\Phi_{d+}=-\pi-alpha+beta$ $d^-$ corresponds to the modulation level $\Delta\Phi_{d-}=-\pi-alpha-beta$.

On the output power P vs time curve, the 8 levels of modulated phase difference $\Delta\Phi_m(t)$ follow each other in a sequence of 12 states per period of modulation T, in the following order: $b^-$ $b^+$ $a^+$ $a^-$ $b^-$ $b^+$ $c^+$ $c^-$ $d^-$ $d^+$ $c^+$ $c^-$.

The detector receiving the interferometric beam acquires 12 power measurements $P_i$ per period of modulation T corresponding to the twelve states i=1, . . . , 12. In other words, the detector samples the power signal P at the frequency 12 $f_p$. More generally, for a modulation of the second phase difference $\Delta\Phi_{alpha}$ (t) and the third phase difference $\Delta\Phi_{beta}(t)$ at $(2N+1)\cdot f_p$, the sampling is made at $4\cdot(2N+1)\cdot f_p$. On the power vs time curve, the effect of the RC time constant of the phase modulator control circuit on the detected power measurements is clearly observed. The value of each power measurement $P_i$ reaches a plateau according to an exponential curve that depends on the difference between the two successive asymptotic power values.

A specific demodulation is applied, according to the searched signal. More precisely, to extract the signal of the quantity to be measured, for example the Sagnac signal, a demodulation of the 12 acquired states is used. Over the period of modulation T equal to 2Δτ, the signs are applied in the following order to the 12 power measurements Pi: −−++−−++−−++. In other words, the power measurement $P_i$ is multiplied by −1 for the levels corresponding to −alpha and by +1 for the levels corresponding to +alpha, independently of the sign of the ±π and ±beta modulations. Hence, the demodulation of the signal of the quantity to be measured modulated on 12 states is expressed as follows in the first embodiment.

$$S_S=P_1-P_2+P_3+P_4-P_5-P_6+P_7+P_8-P_9-P_{10}+P_{11}+P_{12} \quad \text{[Math 11]}$$

It is observed, on the power vs time curve, that the 8-level and 12-state modulation has, for each demodulated state with the sign +, an identical state, i.e. a state with the same history, demodulated with the sign −. Hence, state 1 corresponding to level $b^-$ is identical to state 7 corresponding to level $c^+$; state 2 corresponding to level $b^+$ is identical to state 8 corresponding to level $c^-$; state 3 corresponding to level $a^+$ is identical to state 9 corresponding to level $d^-$; state 4 corresponding to level $a^-$ is identical to state 10 corresponding to level $d^+$; state 5 corresponding to level $b^-$ is identical to state 11 corresponding to level $c^+$; state 6 corresponding to level $b^+$ is identical to state 12 corresponding to level $c^-$. In other words, at each state of the first half-period T/2, demodulated to extract therefrom the quantity to be measured, in + or in −, corresponds to a state of same history, demodulated with the reverse sign, in the second half-period. It is observed that the phase difference $\Delta\Phi_m(t)$ modulated according to the 8-level and 12 state modulation of the first embodiment verifies the following equation at any time t of a period of modulation T, here comprised between 0 and 2Δτ.

$$\Delta\Phi_m(t+T/2)=-\Delta\Phi_m(t) \quad \text{[Math 12]}$$

It results therefrom that the demodulation of a signal modulated according to 8 levels and 12 states as described hereinabove, to extract the signal of the quantity to be measured, for example the Sagnac signal, has no defect induced by the RC time constant, contrary to a demodulation of a signal modulated according to a conventional 8-level and 8-state modulation.

In the first embodiment, the demodulation of the phase modulator transfer function, denoted V is performed by multiplying the power measurements $P_i$ for i=1, . . . , 12 acquired over a period of modulation T by the sign of the product of the ±π modulation + or − sign and the ±alpha modulation + or − sign, independently of the ±beta modulation sign, or by zero in such a way as to keep only as many states multiplied by + as states multiplied by −. The demodulation of the phase modulator transfer function, denoted $V_\pi$, is expressed as follows in the first embodiment.

$$S_{V_\pi}=+P_3+P_4-P_5-P_6+P_9+P_{10}-P_{11}-P_{12} \quad \text{[Math 13]}$$

In the first embodiment, the demodulation of the detection system transfer function, or open-loop response, denoted ΔP, is performed at the frequency $6f_p$ by multiplying the 12 power measurements $P_i$ for i=1, . . . , 12 acquired over a period of modulation T, by the sign of the product of the ±alpha modulation + or − sign and the ±beta modulation + or − sign, independently of the ±π modulation sign. In the example illustrated in FIG. 7, to extract ΔP, the sampling is made at $12f_p$. The high levels in $a^+$ and $c^+$ corresponding to a (+alpha+beta) modulation and the high levels in $b^-$ and $d^-$ corresponding to a (−alpha −beta) modulation are demodulated by multiplying by +1, whereas the low levels in $a^-$ and $c^-$ corresponding to a (+alpha−beta) modulation and the low levels in $b^+$ and $d^+$ corresponding to a (−alpha+beta) modulation are demodulated by multiplying by −1. More precisely, the demodulation of the detection system transfer function, thus the power difference ΔP between high states and low states, modulated on 12 states, is expressed as follows in the first embodiment.

$$S_{\Delta P}=+P_1-P_2+P_3-P_4+P_5-P_6+P_7-P_8+P_9-P_{10}+P_{11}-P_{12} \quad \text{[Math 14]}$$

The first embodiment based on a ±π modulation at $f_p$, ±alpha modulation at $3f_p$ and ±beta modulation at $3f_p$ inducing 8 modulation levels and 12 states per period T makes it possible to extract by a suitable demodulation the signal of the quantity to be measured, the signal $V_\pi$ and the open-loop response signal ΔP, the signal of the quantity to be measured being corrected for the defects induced by the RC time constant of the phase modulator control circuit. This modulation and demodulation scheme makes it possible to improve the performances of an interferometer system without modifying the structure thereof and allows an upgrade of the existing interferometer systems.

A second embodiment will now be described in relation with FIG. 8. Similarly to the first embodiment, the second embodiment is based on a modulation with at least 8 modulation levels and 12 states per period of modulation T equal to 2Δτ.

The modulation is also applied according to 8 levels per period of modulation T. The control signal $C_m(t)$ is here too consisted of the sum of three square modulations. In this second embodiment, the first square modulation induces a first phase difference $\Delta\Phi_\pi(t)$ of level equal to +π. The first phase difference is periodic and has a modulation frequency equal to an odd multiple (2N+1) of the eigen frequency $f_p$, where N is a natural integer higher than or equal to 1. The second square modulation voltage is adapted to induce a second phase difference $\Delta\Phi_{alpha}(t)$ of level equal to ±alpha. The second phase difference $\Delta\Phi_{alpha}(t)$ is periodic and has a modulation frequency equal to the same odd multiple (2N+1) of the eigen frequency $f_p$, where N is a natural integer higher than or equal to 1. The second phase difference $\Delta\Phi_{alpha}(t)$ is in quadrature with respect to the first phase difference $\Delta\Phi_\pi(t)$. The third square modulation voltage is adapted to induce a third phase difference $\Delta\Phi_{beta}(t)$ of level equal to ±beta. The third phase difference ΔΦbeta(t) is periodic and has a modulation frequency equal to $f_p$ synchronized with the first phase difference $\Delta\Phi_\pi(t)$.

Figure 8:
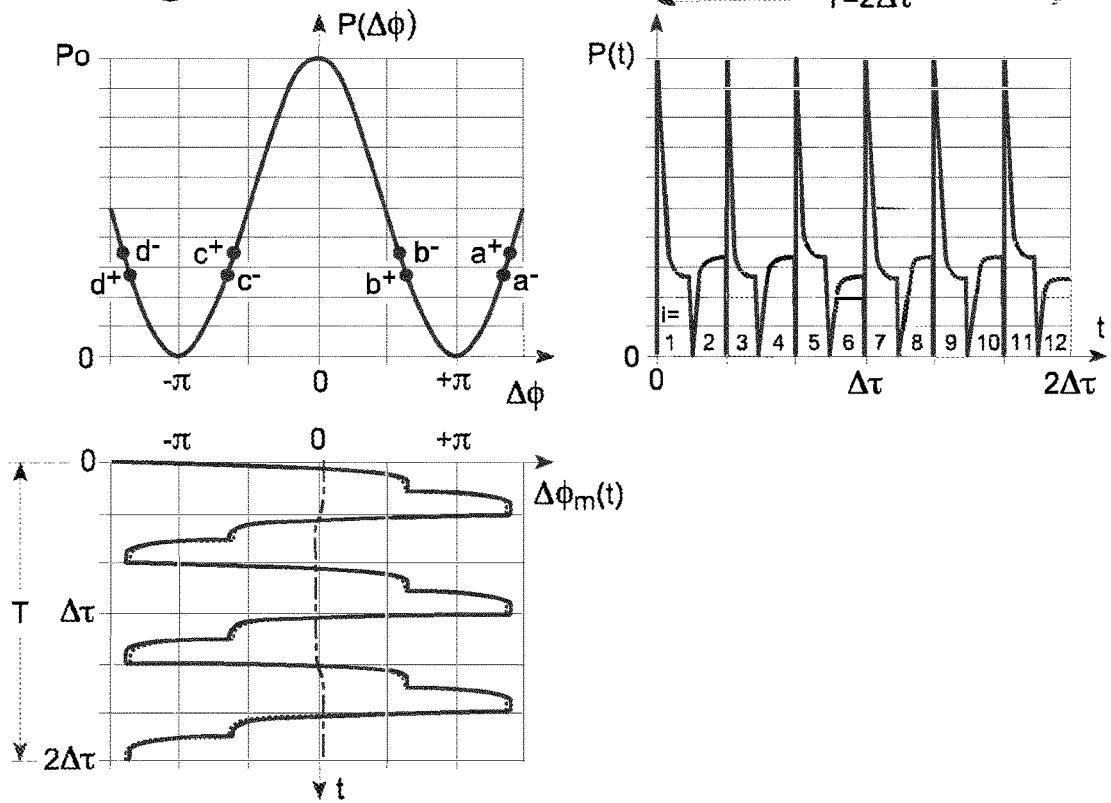
FIG. 8 illustrates a second embodiment based on a modulation with 8 levels of $\Delta\Phi_m(t)$ and 12 states of the corresponding detected power P(t)

In the example illustrated in FIG. 8, the first phase difference $\Delta\Phi_\pi(t)$ and the second phase difference $\Delta\Phi_{alpha}(t)$ are at the frequency $3f_p$ and the following values are chosen for alpha and beta: alpha=3π/8 and beta=3π/128, and RC=Δτ/20.

On the $\Delta\Phi_m(t)$ curve of FIG. 8, the 4-state modulation resulting from the sum of the first periodic phase difference $\Delta\Phi_\pi$ modulated at $3f_p$ and the second phase difference $\Delta\Phi_{alpha}(t)$ modulated at $3f_p$ in quadrature with respect to $\Delta\Phi_\pi(t)$ is shown in dotted line. The third phase difference $\Delta\Phi_{beta}(t)$ modulated on 2 levels at the frequency $f_p$ is shown in dashed line. Finally, the modulated phase difference $\Delta\Phi_m(t)$ or total modulation resulting from the sum of the dotted-line modulation and the dashed-line modulation is shown in continuous line. The modulated phase difference $\Delta\Phi_m(t)$ has also 8 levels. The effect of the RC time constant is observed on the modulated phase difference $\Delta\Phi_m(t)$ curve. Each level of modulated phase difference follows an exponential curve in (1−exp(−t/RC)) that starts from the preceding level.

As in the first embodiment, the modulated phase difference $\Delta\Phi_m(t)$ includes 8 levels and this phase difference $\Delta\Phi_m(t)$ modulated on 8 levels generates 12 modulation states on the output power curve as a function of time, in the following order: $b^+$ $a^+$ $c^-$ $d^-$ $b^-$ $a^-$ $c^-$ $d^-$ $b^+$ $a^+$ $c^+$ $d^+$ corresponding to the phase differences $\Delta\Phi_{a+}$ to $\Delta\Phi_{d-}$ mentioned hereinabove.

The detector acquires 12 power measurements $P_i$ per period of modulation T corresponding to the twelve states i=1, . . . , 12. On the power vs time curve, the effect of the phase modulator RC time constant on the detected power measurements is here also clearly observed.

In the second embodiment, the demodulation of the signal of the quantity to be measured, for example the Sagnac signal, is similar to that of the first embodiment insofar as the power measurement $P_i$ for i=1, 2, . . . , 12 over a period of modulation is multiplied by −1 for the levels corresponding to −alpha and by +1 for the levels corresponding to +alpha, independently of the ±π and ±beta modulations sign. This demodulation scheme is expressed by the following formula in the second embodiment.

$$S_S=-P_1+P_2+P_3-P_4-P_5+P_6+P_7-P_8-P_9+P_{10}+P_{11}-P_{12} \quad \text{[Math 15]}$$

Hence, to each state of the first half-period T/2, demodulated in plus or minus, corresponds a state of same history on the second half-period, demodulated in the reverse direction, i.e. in minus or plus: the pairs 1-7, 2-8, 3-9, 4-10, 5-11 and 6-12 make is possible to cancel the effects induced by the phase modulator RC. Indeed, in the second embodiment, it is observed in FIG. 8 that the phase difference $\Delta\Phi_m(t)$ modulated according to the 8-level and 12-state modulation verifies the equation Math 12 at any time t of the period of modulation, here comprised between 0 and 2Δτ.

Likewise, the demodulation of the phase modulator transfer function, denoted $V_\pi$ demodulation, is made by multiplying the 12 power measurements $P_i$ for i=1, . . . , 12 acquired over a period of modulation T, by the sign of the product of the ±π modulation + or − sign and the ±alpha modulation + or − sign, independently of the sign of the ±beta modulation.

Hence, the demodulation of the phase modulator transfer function, denoted $V_7$, demodulation, on 12 states is expressed in the second embodiment by the following formula.

$$S_{V_\pi}=-P_1+P_2-P_3+P_4-P_5+P_6-P_7+P_8-P_9+P_{10}-P_{11}+P_{12} \quad \text{[Math 16]}$$

Finally, the demodulation of the detection system transfer function, denoted ΔP demodulation, is made by multiplying the 12 power measurements $P_i$ for i=1, . . . , 12 acquired over a period of modulation T, by the sign of the product of the ±alpha modulation + or − sign and the ±beta modulation + or − sign, independently of the ±π modulation sign.

Hence, the demodulation of the detection system transfer function, denoted ΔP, on 12 states is expressed as follows in the second embodiment.

$$S_{\Delta P}=-P_1+P_2-P_3+P_4+P_5-P_6-P_7+P_8-P_9+P_{10}+P_{11}-P_{12} \quad \text{[Math 17]}$$

In the second embodiment, the signal of the quantity to be measured is also corrected for the defects induced by the phase modulator RC time constant.

A third embodiment will now be described in relation with FIG. 9. The third embodiment is based on a modulation with 12 states and 8 levels of modulation per period of modulation T.

The control signal $C_m(t)$ is also consisted of the sum of three square modulations. In the third embodiment, the first square modulation induces a first phase difference $\Delta\Phi_\pi(t)$ of level equal to ±π. The first phase difference is periodic and has a modulation frequency equal to the eigen frequency $f_p$. The second square modulation is adapted to induce a second phase difference $\Delta\Phi_{alpha}(t)$ of level equal to ±alpha. The second phase difference $\Delta\Phi_{alpha}(t)$ is periodic and of modulation frequency equal to the eigen frequency $f_p$, in quadrature with respect to the first phase difference $\Delta\Phi_\pi(t)$. In other words, the sum of the first phase difference and the second phase difference $\Delta\Phi_{alpha}(t)$ produces a 4-state modulation (in dotted line on the modulated phase difference vs time curve in FIG. 9). The third square modulation is adapted to induce a phase shift $\Phi_{beta}(t)$ of level equal to ±beta/2. This modulation $\Delta\Phi_{beta}(t)$ is periodic and has a modulation frequency equal to an odd sub-harmonic of the eigen frequency: $f_p/(2N+1)$, where N is a natural integer higher than or equal to 1. The period of modulation is then equal to $2 \cdot (2N+1) \cdot \Delta\tau$. The third modulation $\Phi_{beta}(t)$ is synchronized with the first phase difference $\Delta\Phi_\pi(t)$ or the second phase difference $\Delta\Phi_{alpha}(t)$ The third modulation $\Phi_{beta}(t)$ of the phase shift induces a phase difference $\Delta\Phi_{beta}(t)=\Phi_{beta}(t)-\Phi_{beta}(t-\Delta\tau)$ in 6 levels that switch every $\Delta\tau$ in the following sequence: +beta, 0, 0, −beta, 0, 0 (shown in dashed line on the modulated phase difference vs time curve in FIG. 9).

Figure 9:
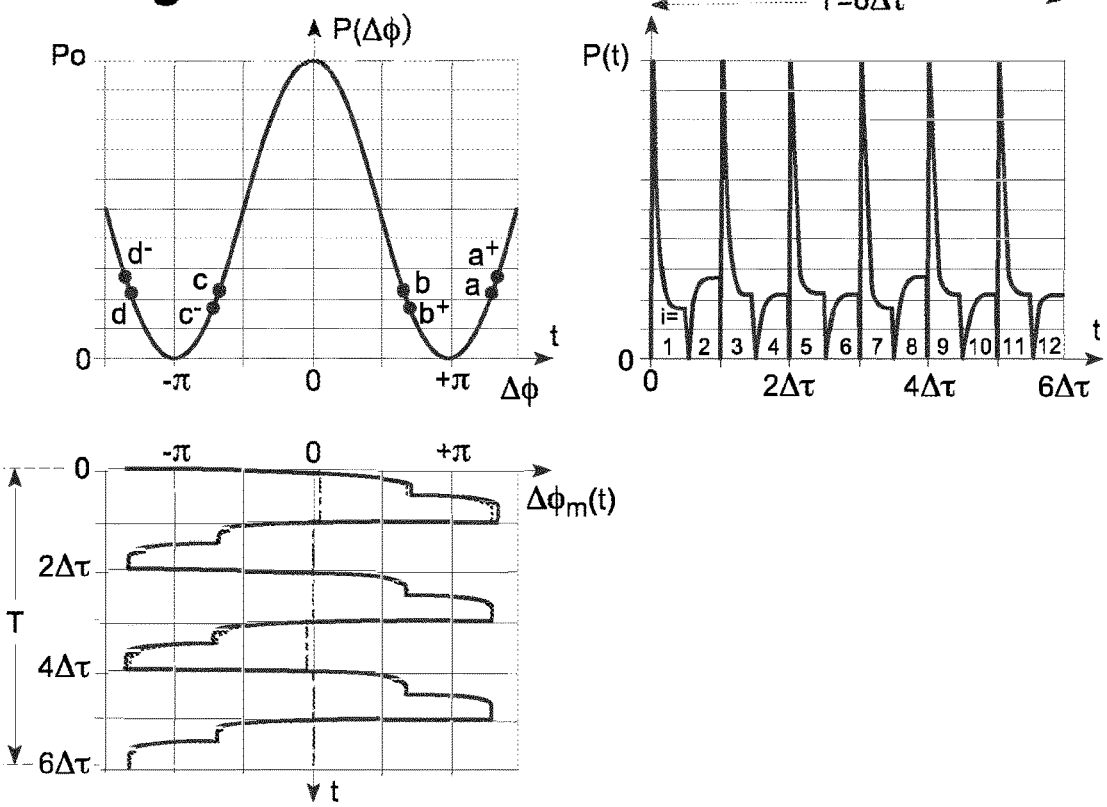
FIG. 9 illustrates a third embodiment based on a modulation with 8 levels of $\Delta\Phi_m(t)$ and 12 states of the corresponding detected power P(t)

In the example illustrated in FIG. 9, the modulation frequency of the phase shift $\Phi_{beta}(t)$ is equal to $f_p/3$ and the period of modulation T is equal to $6\Delta\tau$. In the example illustrated in FIG. 9, the following values are chosen for alpha and beta: alpha=$3\pi/8$ and beta=$5\pi/128$. The RC value is exaggerated with respect to reality to make FIG. 9 more readable and is herein equal to $\Delta\tau/10$.

The modulated phase difference $\Delta\Phi_m(t)$ or total modulation resulting from the sum of the dotted-line modulation and the dashed-line modulation has a period of modulation T equal to $(2N+1) \cdot 2\Delta\tau$. In the example of FIG. 9, the modulated phase difference $\Delta\Phi_m(t)$ induces 8 levels per period of modulation T. These 8 modulation levels produce on the power measurement curve a sequence of 12 states, which switch every $\Delta\tau/2$ in the order of appearance according to a period of modulation T: b⁺ a⁺ c d b a c⁻ d⁻ b a c d.

In FIG. 9, a+ corresponds to the modulation level $\Delta\Phi_{a+}=\pi+$alpha+beta; a corresponds to the modulation level $\Delta\Phi_a=\pi+$alpha; b⁺ corresponds to the modulation level $\Delta\Phi_{b+}=\pi-$alpha+beta; b corresponds to the modulation level $\Delta\Phi_b=\pi-$alpha; c corresponds to the modulation level $\Delta\Phi_c=-\pi+$alpha; c⁻ corresponds to the modulation level $\Delta\Phi_{c-}=-\pi+$alpha−beta; d corresponds to the modulation level $\Delta\Phi_d=-\pi-$alpha; d⁻ corresponds to the modulation level $\Delta\Phi_{d-}=-\pi-$alpha−beta.

On the output power P vs phase difference $\Delta\Phi$ curve of FIG. 9, the levels of modulated phase difference $\Delta\Phi_m(t)$ generate 12 modulation states per period of modulation. In FIG. 9, it is observed that the phase difference $\Delta\Phi_m(t)$ modulated according to the 8-level and 12-state modulation of the third embodiment verifies the equation Math 12 at any time t of the period of modulation T, which is here equal to $6\Delta\tau$.

As in the first and second embodiments, during the demodulation of the signal of the quantity to be measured, for example the Sagnac signal, to each state of the first half-period T/2, demodulated to extract therefrom the quantity to be measured, in + or in −, corresponds a state of same history, demodulated with the reverse sign, in the second half-period. This demodulation scheme is expressed by the following formula in the third embodiment.

$$S_S=-P_1+P_2+P_3-P_4-P_5+P_6+P_7-P_8-P_9+P_{10}+P_{11}-P_{12} \quad \text{[Math 18]}$$

The demodulation of the phase modulator transfer function, denoted $V_\pi$, is made by multiplying the 12 power measurements $P_i$ for i=1, . . . , 12 acquired on a period of modulation T, by the sign of the product of the ±π modulation + or − sign and the ±alpha modulation + or − sign, independently of the ±beta modulation sign.

Hence, the demodulation of the phase modulator transfer function $V_\pi$ modulated on 12 states is expressed for this third embodiment according to the same equation (Math 16) as for the second embodiment.

Finally, the demodulation of the detection system transfer function, denoted $\Delta P$, is made by multiplying the 12 power measurements $P_i$ for i=1, . . . , 12 acquired over the period of modulation T=$6\Delta\tau$, by the sign of the product of the ±alpha modulation + or − sign and the ±beta modulation + or − sign when beta is non zero and by 0 when beta is zero, independently of the ±π modulation sign. In particular, beta is zero for the states a, b, c and d.

Hence, the demodulation of the detection system transfer function $\Delta P$ on 12 states is expressed as follows in the third embodiment.

$$S_{\Delta P}=-P_1+P_2-P_7+P_8 \quad \text{[Math 19]}$$

In the third embodiment too, the signal of the quantity to be measured is corrected for the defects induced by the phase modulator RC time constant.

Figure 10:
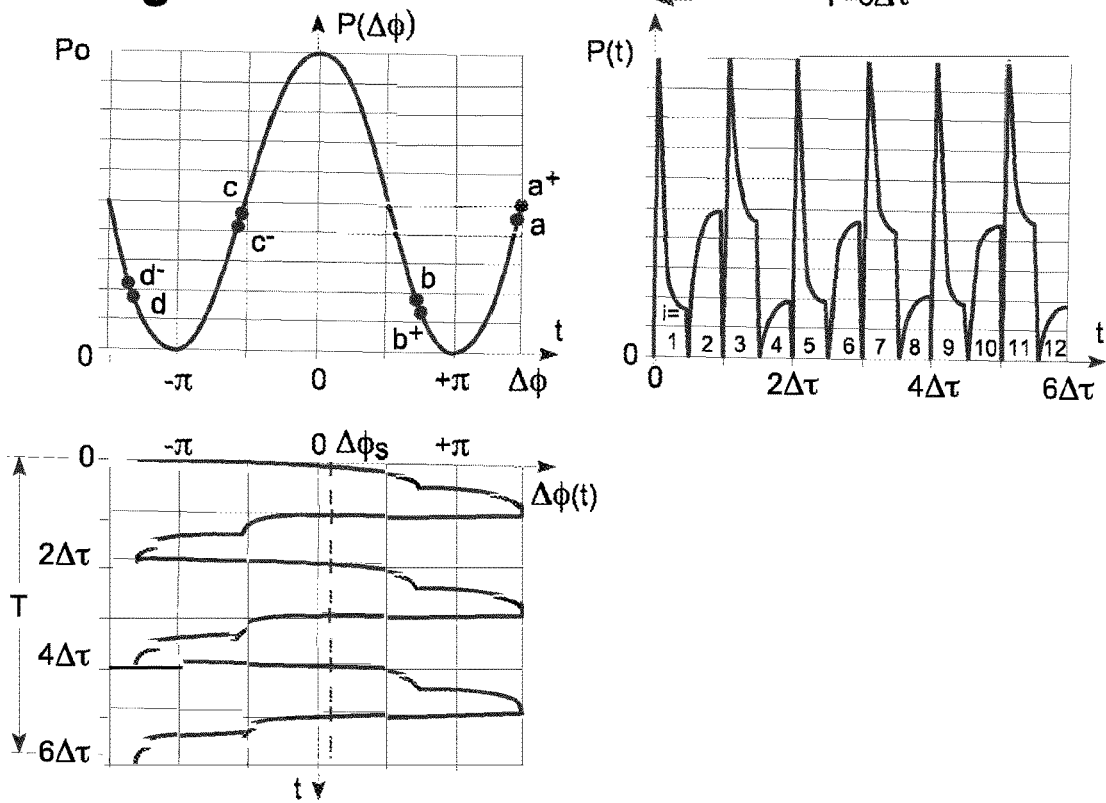
FIG. 10 schematically shows an example of modulation according to the third embodiment and the power P(t) detected in the presence of a Sagnac signal.

FIG. 10 illustrates an example of the third embodiment in presence of a signal of the quantity to be measured. In the example illustrated in FIG. 10, the following values are chosen for alpha and beta: alpha=$3\pi/8$ and beta=$3\pi/128$. RC is equal to $\Delta\tau/12$. The phase difference induced by the quantity to be measured is here equal to $\Delta\Phi_S=3\pi/32$. The measurement of $\Delta\Phi_S$ is corrected for the defects induced by the phase modulator RC time constant. Therefore, the measurement has a better stability.

Advantageously, the 8-level and 12-state modulation according to any one of the embodiments described hereinabove is used to control the signal of the parameter to be measured (for example, the Sagnac signal), the adjustment of the signal $V_\pi$ and/or the open-loop response (or signal $\Delta P$).

In summary, the table below shows the demodulation rules for the three embodiments described hereinabove.

TABLE 1

| π mod. | π and alpha mod. | π, alpha and beta mod. | Modulation levels | Demodulation of the parameter to be measured | Demodulation of $V_\pi$ | Demodulation of $\Delta P$ |
|---|---|---|---|---|---|---|
| +π | +π + alpha | +π + alpha + beta | a⁺ | + | + | + |
|    |            | +π + alpha        | a  | + | + | 0 |
|    |            | +π + alpha − beta | a⁻ | + | + | − |
|    | +π − alpha | +π − alpha + beta | b⁺ | − | − | − |
|    |            | +π − alpha        | b  | − | − | 0 |
|    |            | +π − alpha − beta | b⁻ | − | − | + |

TABLE 1-continued

| π mod. | π and alpha mod. | π, alpha and beta mod. | Modulation levels | Demodulation of the parameter to be measured | Demodulation of $V_\pi$ | Demodulation of $\Delta P$ |
|---|---|---|---|---|---|---|
| −π | −π + alpha | −π + alpha + beta | c⁺ | + | − | + |
|  |  | −π + alpha | c | + | − | 0 |
|  |  | −π + alpha − beta | c⁻ | + | − | − |
|  | −π − alpha | −π − alpha + beta | d⁺ | − | + | − |
|  |  | −π − alpha | d | − | + | 0 |
|  |  | −π − alpha − beta | d⁻ | − | + | + |

The invention applies to a fiber-optic Sagnac loop interferometer system for measuring a rotation rate about the axis of the optical fiber coil, for example as illustrated in FIG. 1. In the fiber-optic Sagnac loop interferometer system, the first single-mode wave 101 and the second single-mode wave 102 are linearly polarized and the optical fiber coil 17 is of the linear polarization maintaining type. The signal processing system 900 applies a modulation voltage 60 to the electrodes of the optical phase modulator 16 in such a way as to generate an at least 8-state and 12-level modulation of the phase difference according to any one of the above-described embodiments. The signal processing system 900 applies to the detected signal 80 a suitable demodulation as a function of the chosen modulation.

The invention also applies to a fiber-optic loop or in-line interferometer for applications as a magnetic field sensor or as an electric current sensor.

Figure 11:
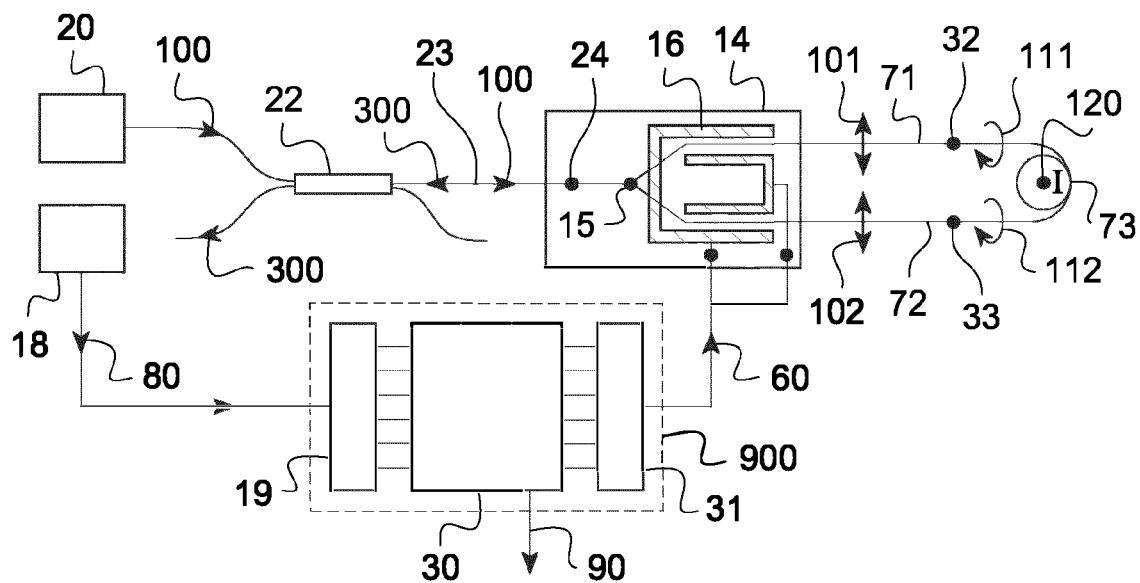
FIG. 11 schematically shows a fiber-optic loop interferometer system for application to an electric current sensor according to the present disclosure.

By way of non-limitative example, FIG. 11 shows a fiber-optic loop interferometer intended for an application as an electric current sensor. The same signs of reference denote the same elements as in FIG. 1. In this application, an optical fiber set includes an optical fiber section 71, an optical fiber coil 73 and another optical fiber section 72 arranged in series. The optical fiber 73 is wound around an axis. The optical fiber 73 is preferably of the circular polarization maintaining type. The optical fiber section 71 is preferably of the linear polarization maintaining type. The other optical fiber section 72 is also preferably of the linear polarization maintaining type. An electrical conductor 120 is arranged along the axis of the optical fiber coil 73. An electric current running through the optical fiber coil 73 is denoted I. The integrated optical circuit 14 is similar to that described in relation with FIG. 1. At the output of the integrated optical circuit 14, the first single-mode wave 101 and the second single-mode wave 102 are linearly polarized according to the same polarization state. The first single-mode wave 101 propagates in the optical fiber section 71. The second single-mode wave 102 propagates in the other optical fiber section 72. A quarter-wave plate 32 receives the first linearly polarized single-mode wave 101 and transmits a first circularly polarized single-mode wave 111, for example with a right circular polarization, to one end of the optical fiber coil 73. Another quarter-wave plate 33 receive the second linearly polarized single-mode wave 102 and transmits a second circularly polarized single-mode wave 112, here for example with a right circular polarization too, to the other end of the optical fiber coil 73. The first right circular single-mode wave 111 and the second right circular single-mode wave 112 propagate in reverse direction in the optical fiber coil 73. At the output of the optical fiber coil 73, the quarter-wave plates 32, 33 transform the circularly polarized waves into linearly polarized waves that recombine with each other to form the interferometric beam 300. The signal processing system 900 applies any one of the at least 8-state and 12-level modulation-demodulation schemes to extract an electric current measurement corrected for the phase modulator RC time constant. The propagation time difference $\Delta\tau$ to be considered for the phase modulation $\Delta\Phi_m(t)$ is then the time of propagation in the optical fiber 73 and in the fiber sections 71 and 72.

Figure 12:
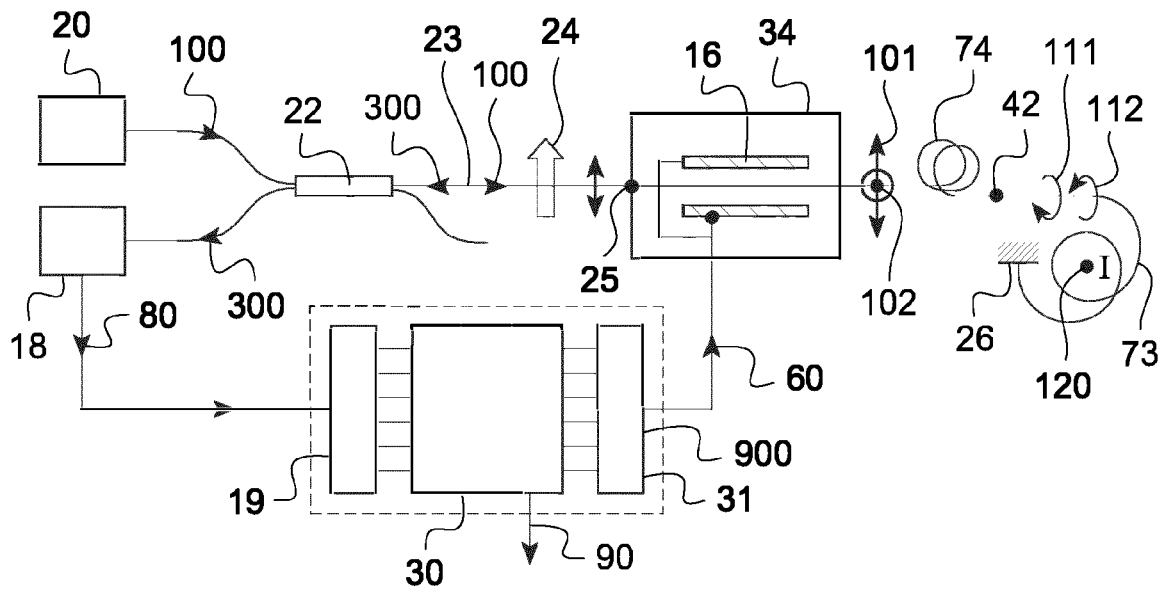
FIG. 12 schematically shows a fiber-optic in-line interferometer system for application to an electric current sensor according to the present disclosure.

By way of other non-limitative example, FIG. 12 shows a fiber-optic in-line interferometer intended for an application as an electric current sensor. In this example, a polarizer 24 polarizes linearly the source beam 100. The integrated optical circuit 34 includes only a waveguide formed for example by diffusion of titanium into a lithium niobate substrate. The electrodes of the phase modulator 16 are deposited along the sides of the waveguide. The waveguide of the integrated optical circuit 34 is birefringent. The optical axes of the polarizer 24 are preferably oriented at 45 degrees with respect to the birefringence axes of the waveguide of the integrated optical circuit 34 at the input-output 25 of the integrated optical circuit 34. That way, the polarizer 24 and the integrated optical circuit 34 split in polarization the source beam 100 and generate the first single-mode wave 101 polarized according to a linear polarization state and the second single-mode wave 102 polarized according to the orthogonal linear polarization state. The waveguide of the integrated optical circuit 34 guides the two polarizations. The phase modulator 16 having a different efficiency according to the polarization, it actually generates a modulation differential of the phase shift of the two waves, and will allow the same phase modulations as in the loop configuration. For this differential modulator, it is often talked about a birefringence modulator. In this embodiment, the optical fiber set includes an optical fiber section 74 and an optical fiber coil 73 arranged in series. The optical fiber 73 is wound about an axis. The optical fiber 73 is preferably of the circular polarization maintaining type. The optical fiber section 74 is preferably of the linear polarization maintaining type. The first single-mode wave 101 and the second single-mode wave 102 propagate in the optical fiber section 74. A quarter-wave plate 42 receives the first linearly polarized single-mode wave 101 and transmits a first circularly polarized single-mode wave 111, for example with a right circular polarization, to one end of the optical fiber coil 73. The quarter-wave plate 42 receives the second single-mode wave 102 polarized according to another orthogonal linear polarization state and transmits a second circularly polarized single-mode wave 112, for example with a left circular polarization, to the same end of the optical fiber coil 73. A mirror 26 is arranged at the other end of the optical fiber coil 73. After a first passage in the optical fiber coil 73, the two single-mode waves of orthogonal circular polarization 111, 112 reflect on the mirror 26. Upon reflection on the mirror, their polarization states are inverted. The two single-mode waves perform a second passage in the reverse direction, and with their polarizations inverted, in the optical fiber coil 73. The quarter-wave plate 42 receives the two single-mode waves of orthogonal circular polarizations and transform them into two optical waves of orthogonal linear polarizations. The integrated optical circuit 34 and the polarizer 24 recombine these two waves and form the interferometric beam 300. The signal processing system 900 applies any one of the at least 8-state and 12-level modulation-demodulation schemes to extract an electric current measurement corrected for the phase modulator RC time constant. In this case, the propagation time difference $\Delta\tau$ to be considered for the phase modulation $\Delta\Phi_m(t)$ is the roundtrip propagation time in the optical fiber section 74 and the optical fiber coil 73.

Figure 13:
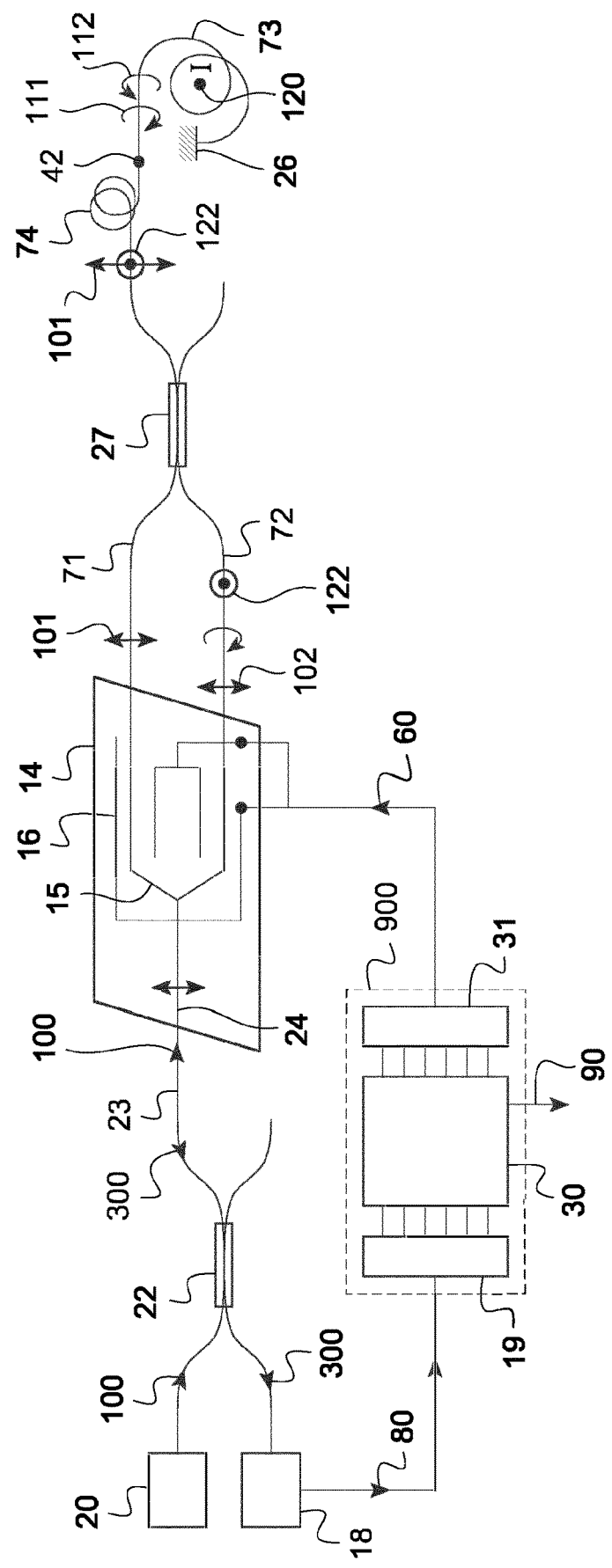
FIG. 13 schematically shows another fiber-optic in-line interferometer system for application to an electric current sensor according to the present disclosure.

FIG. 13 shows another example of fiber-optic in-line interferometer intended for an application as an electric current sensor. In this example, the integrated optical circuit 14 comprises a polarizing waveguide 24 and a splitter 15, of the Y-junction type, similar to that described in relation with FIGS. 1 and 11. The optical fiber set here includes an optical fiber section 71, another optical fiber section 72, an optical fiber section 74 and an optical fiber coil 73. The optical fiber 73 is wound about an axis. The optical fiber 73 is preferably of the circular polarization maintaining. The optical fiber sections 71, 72 and 74 are preferably of the linear polarization maintaining. The waveguide 24 linearly polarizes the source beam 100. The splitter 15 splits the linearly polarized source beam 100 into the first linearly polarized single-mode wave 101 and the second linearly polarized single-mode wave 102 according to the same linear polarization state. The first single-mode wave 101 propagates in the optical fiber section 71. The second single-mode wave 102 propagates in the other optical fiber section 72. The other optical fiber section 72 is oriented in such a way as to rotate by 90 degrees the linear polarization of the second single-mode wave 102, which hence becomes a second single-mode wave 122 linearly polarized with a polarization orthogonal to the first single-mode wave 101. A polarization coupler-splitter 27 recombines the first single-mode wave 101 and the second single-mode wave 122, of orthogonal linear polarizations that propagate in the optical fiber section 74. A quarter-wave plate 42 transforms the orthogonal linear polarizations into orthogonal circular polarizations 111, 112. Similarly to the embodiment described in relation with FIG. 12, the mirror 26 reflects the two single-mode waves 111, 112 and inverts the polarizations thereof. That way, the two single-mode waves run through the optical fiber set with inverted polarization states. The signal processing signal 900 applies any one of the at least 8-state and 12-level modulation-demodulation schemes to extract an electric current measurement corrected for the phase modulator RC time constant. The propagation time difference $\Delta\tau$ to be considered in this case for the phase modulation $\Delta\Phi_m(t)$ is the time of propagation in the optical fiber sections 71 and 72 and the roundtrip propagation time in the fiber section 74 and the optical fiber 73.

Of course, various other modifications can be brought to the invention within the scope of the appended claims.

The invention claimed is:

1. A fiber-optic loop, or respectively in-line, interferometer comprising:
   a light source adapted to generate a source beam,
   a polarizer and a coil splitter arranged to split the source beam into a first single-mode wave and a second single-mode wave, the first single-mode wave and the second single-mode wave having a same polarization state, or respectively orthogonal polarization states,
   a digital processor and a digital-analog converter adapted to apply a modulation electric voltage $V_m(t)$ to a phase modulator adapted to induce a same phase shift $\Phi_m(t)$ on the first single-mode wave and the second single-mode wave,
   an optical fiber coil adapted to receive and propagate the first single-mode wave along a first optical path and the second single-mode wave along a second optical path, the first optical path and the second optical path being in reverse direction in the optical fiber coil, or respectively the first optical path and the second optical path comprising a first passage in the optical fiber coil, a reflection on a mirror and a second passage in the reverse direction in the optical fiber coil, the orthogonal polarization states being inverted upon reflection on the mirror, and to form after a propagation time difference $\Delta\tau$ a first output wave and a second output wave, respectively, having a modulated phase difference $\Delta\Phi_m(t)=\Phi_m(t)-\Phi_m(t-\Delta\tau)$, the optical fiber coil having an eigen frequency $f_p$ equal to the inverse of the double of the propagation time difference $\Delta\tau$,
   the coil splitter being adapted to recombine the first output wave and the second output wave and to form a temporally modulated interferometric beam,
   a photosensor and an analog-digital converter adapted to detect a power P(t) of the interferometric beam as a function of time,
   wherein the modulated phase difference $\Delta\Phi_m(t)$ is equal to the sum of a first periodic phase difference $\Delta\Phi_\Pi(t)$ of level equal to $\pm\Pi$, a second periodic phase difference $\Delta\Phi_{alpha}(t)$ of level equal to $\pm$alpha and a third periodic phase difference $\Delta\Phi_{beta}(t)$ of variable level between $-$beta and +beta, alpha and beta having predetermined different values, in such a way that the modulated phase difference $\Delta\Phi_m(t)$ has a period of modulation T equal to an odd multiple (2M+1) of the double of the propagation time difference $\Delta\tau$, where M is a natural integer, the modulated phase difference $\Delta\Phi_m(t)$ having, per period of modulation T, at least eight modulation levels among the twelve following modulation levels: $\Delta\Phi_{a+}=\Pi+$alpha+beta; $\Delta\Phi_{a-}=\Pi+$alpha$-$beta; $\Delta\Phi_a=\Pi+$alpha; $\Delta\Phi_{b+}=\Pi-$alpha+beta; $\Delta\Phi_{b-}=\Pi-$alpha$-$beta; $\Delta\Phi_b=\Pi-$alpha; $\Delta\Phi_{c+}=-\Pi+$alpha+beta; $\Delta\Phi_{c-}=-\Pi+$alpha$-$beta; $\Delta\Phi_c=-\Pi+$alpha; $\Delta\Phi_{d+}=-\Pi-$alpha+beta; $\Delta\Phi_{d-}=-\Pi-$alpha$-$beta; $\Delta\Phi_d=-\Pi-$alpha; and this modulated phase difference being such that:

a. $\Delta\Phi_m(t+T/2)=-\Delta\Phi_m(t)$ b. at each time t comprised between 0 and T.

2. The fiber-optic loop or in-line interferometer according to claim 1, wherein the period of modulation T is equal to the double of the propagation time difference $\Phi\tau$, the first periodic phase difference $\Delta\Phi_\Pi(t)$ has a modulation frequency equal to the eigen frequency $f_p$ and wherein
   the second periodic phase difference $\Delta\Phi_{alpha}(t)$ and the third periodic phase difference $\Delta\Phi_{beta}(t)$ have a same modulation frequency equal to an odd multiple (2N+1) of the eigen frequency $f_p$, where N is a non-zero natural integer,
   the second periodic phase difference $\Delta\Phi_{alpha}(t)$ being synchronized with the first periodic phase difference $\Delta\Phi_\Pi(t)$,
   the third periodic phase difference $\Delta\Phi_{beta}(t)$ being in phase quadrature with respect to the second periodic phase difference $\Delta\Phi_a(t)$.

3. The fiber-optic loop or in-line interferometer according to claim 2, wherein the digital processor is adapted to extract a signal representative of a quantity to be measured, a transfer function signal of the phase modulator and/or a transfer function signal of the photosensor and analog-digital converter from a series of at least 12 power measurements of the detected interferometric beam per period of modulation.

4. The fiber-optic loop or in-line interferometer according to claim 1, wherein:
the period of modulation T is equal to the double of the propagation time difference $\Phi\tau$, the third periodic phase difference $\Delta\Phi_{beta}(t)$ having a modulation frequency equal to the eigen frequency $f_p$ and wherein
the first periodic phase difference $\Delta\Phi_\Pi(t)$ and the second periodic phase difference $\Delta\Phi_{alpha}(t)$ have a same modulation frequency equal to an odd multiple (2N+1) of the eigen frequency $f_p$, where N is a non-zero natural integer,
the second periodic phase difference being in phase quadrature with respect to the first periodic phase difference,
the third periodic phase difference $\Delta\Phi_{beta}(t)$ being synchronized with the first periodic phase difference or with the second periodic phase difference.

5. The fiber-optic loop or in-line interferometer according to a claim 4, wherein the digital processor is adapted to extract a signal representative of a quantity to be measured, a transfer function signal of the phase modulator and/or a transfer function signal of the photosensor and analog-digital converter from a series of at least 12 power measurements of the detected interferometric beam per period of modulation.

6. The fiber-optic loop or in-line interferometer according to claim 1, wherein M is a non-zero integer and wherein:
the first periodic phase difference $\Delta\Phi_\Pi(t)$ and the second periodic phase difference $\Delta\Phi_{alpha}(t)$ have a same modulation frequency equal to the eigen frequency $f_p$,
the second periodic phase difference being in phase quadrature with respect to the first periodic phase difference and
the third periodic phase difference $\Delta\Phi_{beta}(t)$ having a period of modulation equal to the period of modulation T, this third periodic phase difference being synchronized with the first periodic phase difference or the second periodic phase difference.

7. The fiber-optic loop or in-line interferometer according to claim 6, wherein the digital processor is adapted to extract a signal representative of a quantity to be measured, a transfer function signal of the phase modulator and/or a transfer function signal of the photosensor and analog-digital converter from a series of at least 12 power measurements of the detected interferometric beam per period of modulation.

8. The fiber-optic loop or in-line interferometer according to claim 1, wherein the digital processor is adapted to extract a signal representative of a quantity to be measured, a transfer function signal of the phase modulator and/or a transfer function signal of the photosensor and analog-digital converter from a series of at least 12 power measurements of the detected interferometric beam per period of modulation.

9. The fiber-optic loop or in-line interferometer according to claim 8, wherein the signal representative of the quantity to be measured is equal to a sum of the interferometric beam power measurements acquired per period of modulation, each power measurement being multiplied by −1 for the levels corresponding to −alpha and by +1 for the levels corresponding to +alpha.

10. The fiber-optic loop or in-line interferometer according to claim 6, wherein the transfer function signal of the phase modulator is equal to a sum of the interferometric beam power measurements acquired per period of modulation, each power measurement being multiplied by the sign of the product of the first ±n modulation sign and the second ±alpha modulation + or − sign, or by zero in such a way as to keep a same number of states multiplied by the sign + and states multiplied by the sign −.

11. The fiber-optic loop or in-line interferometer according to claim 9, wherein the transfer function signal of the photosensor and analog-digital converter is equal to a sum of the interferometric beam power measurements acquired per period of modulation, each power measurement being multiplied by the sign of the product of the second ±alpha modulation sign and the third ±beta modulation sign when the level of this last modulation is +beta or −beta, and by zero when the level of this third beta modulation is zero.

12. The fiber-optic loop or in-line interferometer according to claim 8, wherein the transfer function signal of the phase modulator is equal to a sum of the interferometric beam power measurements acquired per period of modulation, each power measurement being multiplied by the sign of the product of the first ±n modulation sign and the second ±alpha modulation + or − sign, or by zero in such a way as to keep a same number of states multiplied by the sign + and states multiplied by the sign −.

13. The fiber-optic loop or in-line interferometer according to claim 7, wherein the transfer function signal of the photosensor and analog-digital converter is equal to a sum of the interferometric beam power measurements acquired per period of modulation, each power measurement being multiplied by the sign of the product of the second ±alpha modulation sign and the third ±beta modulation sign when the level of this last modulation is +beta or −beta, and by zero when the level of this third beta modulation is zero.

14. The fiber-optic loop or in-line interferometer according to claim 8, wherein the transfer function signal of the photosensor and analog-digital converter is equal to a sum of the interferometric beam power measurements acquired per period of modulation, each power measurement being multiplied by the sign of the product of the second ±alpha modulation sign and the third ±beta modulation sign when the level of this last modulation is +beta or −beta, and by zero when the level of this third beta modulation is zero.

15. The fiber-optic loop or in-line interferometer according to claim 8, wherein the modulated phase difference $\Delta\Phi_m(t)$ further includes a ramp composed of phase steps $\Delta\Phi_{FB}$ opposite to a phase difference $\Delta\Phi_S$ of the signal representative of the quantity to be measured.

16. A fiber-optic loop interferometer according to claim 1, wherein
the coil splitter is adapted to spatially split the source beam into the first single-mode wave and the second single mode wave and wherein
the optical fiber coil is adapted to receive the first single-mode wave at a first end of the optical fiber coil and the second single-mode wave at a second end of the optical fiber coil, respectively,
the first single-mode wave and the second single-mode wave propagating in reverse direction in the optical fiber coil.

17. The fiber-optic loop interferometer according to claim 16, wherein the first single-mode wave and the second single-mode wave are linearly polarized and the optical fiber coil is linear polarization maintaining, the interferometer being adapted to measure a phase difference representative of a rotation about an axis of the optical fiber coil.

18. The fiber-optic loop interferometer according to claim 16, wherein the optical fiber coil is circular polarization maintaining and wherein the fiber-optic loop interferometer includes:
- a linear polarization maintaining optical fiber section,
- another linear polarization maintaining optical fiber section,
- a quarter-wave plate being arranged between the optical fiber section and an end of the optical fiber coil,
- another quarter-wave plate being arranged between the other optical fiber section and the other end of the optical fiber coil,
- the interferometer being adapted to measure a phase difference induced by an electric current passing through the optical fiber coil.

19. A fiber-optic in-line interferometer according to claim 1, wherein the optical fiber coil is circular polarization maintaining and further including:
- a linear polarization maintaining optical fiber section
- the optical fiber section being connected to one end of the optical fiber coil,
- the mirror being arranged at a second end of the optical fiber coil,
- the interferometer being adapted to measure a phase difference induced by an electric current running through the optical fiber coil.

\* \* \* \* \*